United States Patent
Takahashi et al.

(10) Patent No.: US 10,032,921 B2
(45) Date of Patent: Jul. 24, 2018

(54) SEMICONDUCTOR DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventors: Kei Takahashi, Kanagawa (JP); Atsushi Miyaguchi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 9 days.

(21) Appl. No.: 15/207,631

(22) Filed: Jul. 12, 2016

(65) Prior Publication Data
US 2017/0033792 A1    Feb. 2, 2017

(30) Foreign Application Priority Data

Jul. 31, 2015 (JP) .................. 2015-151416
Jun. 14, 2016 (JP) .................. 2016-117684

(51) Int. Cl.
| | |
|---|---|
| *H03K 17/687* | (2006.01) |
| *H01L 29/786* | (2006.01) |
| *H01L 27/12* | (2006.01) |
| *H03K 19/00* | (2006.01) |
| *G02F 1/1333* | (2006.01) |
| *G02F 1/1335* | (2006.01) |
| *G02F 1/1343* | (2006.01) |
| *G02F 1/1362* | (2006.01) |
| *G02F 1/1368* | (2006.01) |
| *G06F 3/041* | (2006.01) |

(52) U.S. Cl.
CPC ...... *H01L 29/78648* (2013.01); *H01L 27/124* (2013.01); *H01L 27/1225* (2013.01); *H01L 27/1251* (2013.01); *H01L 29/7869* (2013.01); *H03K 19/0021* (2013.01); *G02F 1/1368* (2013.01); *G02F 1/133345* (2013.01); *G02F 1/133512* (2013.01); *G02F 1/134309* (2013.01); *G02F 1/136286* (2013.01); *G02F 2201/121* (2013.01); *G02F 2201/123* (2013.01); *G06F 3/041* (2013.01); *H03K 2217/0036* (2013.01)

(58) Field of Classification Search
None
See application file for complete search history.

(56) References Cited

U.S. PATENT DOCUMENTS

| | | | | |
|---|---|---|---|---|
| 6,975,142 B2 * | 12/2005 | Azami | ............. | H03K 19/01714 257/350 |
| 7,365,578 B2 * | 4/2008 | Senda | .................... | G11C 5/145 327/108 |
| 8,067,775 B2 | 11/2011 | Miyairi et al. | | |
| 8,106,400 B2 | 1/2012 | Miyairi et al. | | |

(Continued)

*Primary Examiner* — Lincoln Donovan
*Assistant Examiner* — Khareem E Almo
(74) *Attorney, Agent, or Firm* — Fish & Richardson P.C.

(57) ABSTRACT

A semiconductor device with a novel structure is provided. A semiconductor device with reduced power consumption is provided. A circuit which is configured to supply a signal from an input terminal to both a gate and a backgate of a transistor in a first state and to only the gate in a second state is provided. With this structure, a current supply capability of the transistor can be changed between operations; accordingly, power consumption can be reduced by the amount needed to charge the backgate.

19 Claims, 24 Drawing Sheets

(56) References Cited

U.S. PATENT DOCUMENTS

| | | |
|---|---|---|
| 8,188,477 B2 | 5/2012 | Miyairi et al. |
| 8,718,224 B2 | 5/2014 | Toyotaka |
| 8,907,348 B2 | 12/2014 | Miyairi et al. |
| 9,000,431 B2 | 4/2015 | Miyairi et al. |
| 9,029,851 B2 | 5/2015 | Miyairi et al. |
| 9,083,335 B2 * | 7/2015 | Koyama .......... H03K 19/09441 |
| 9,100,007 B2 * | 8/2015 | Zhu ................. H03K 17/04163 |
| 9,106,210 B2 * | 8/2015 | Devarajan ................ H03K 5/01 |
| 9,219,158 B2 | 12/2015 | Miyairi et al. |
| 9,318,512 B2 | 4/2016 | Miyairi et al. |
| 9,520,880 B2 * | 12/2016 | Eversmann ...... H03K 19/09407 |
| 9,571,094 B2 * | 2/2017 | Hiraoka ............. H03K 17/6871 |
| 9,666,606 B2 * | 5/2017 | Matsuzaki .......... H01L 27/1225 |
| 9,748,946 B2 * | 8/2017 | Sugiura .................. H03K 17/30 |
| 9,761,598 B2 * | 9/2017 | Kurokawa ........ H01L 27/11529 |
| 2002/0158829 A1 * | 10/2002 | Yamazaki ............ G09G 3/2011 |
| | | 345/89 |
| 2006/0208977 A1 * | 9/2006 | Kimura ................ G09G 3/2014 |
| | | 345/76 |
| 2010/0102313 A1 | 4/2010 | Miyairi et al. |
| 2010/0102314 A1 | 4/2010 | Miyairi et al. |
| 2010/0301326 A1 | 12/2010 | Miyairi et al. |
| 2014/0246669 A1 | 9/2014 | Miyairi et al. |
| 2016/0197166 A1 | 7/2016 | Miyairi et al. |

\* cited by examiner

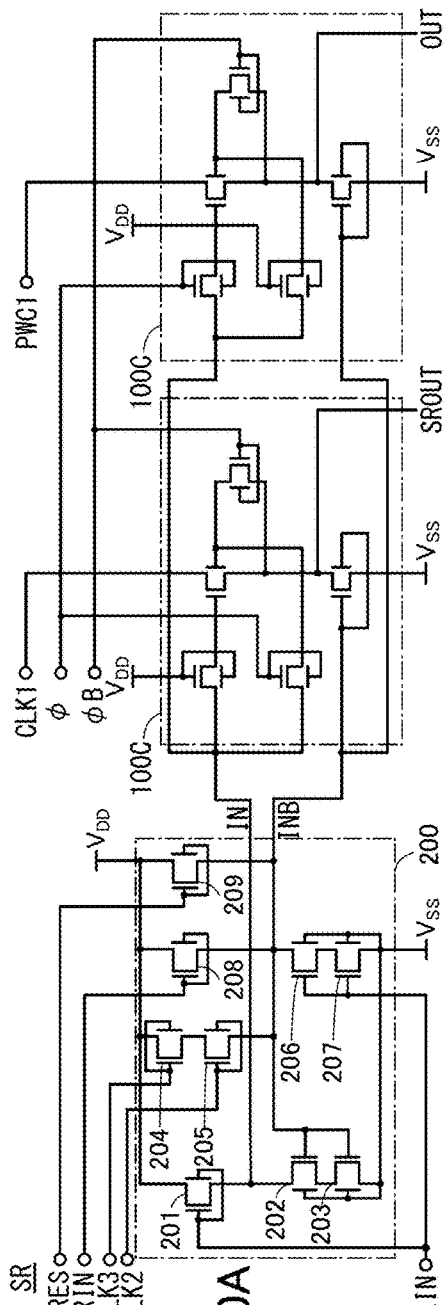
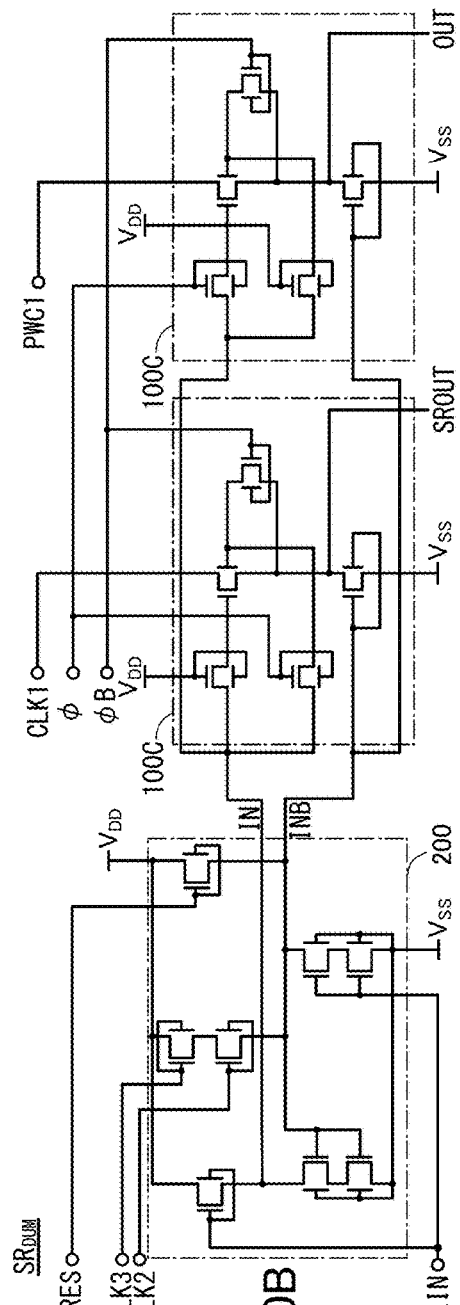
FIG. 10A
FIG. 10B

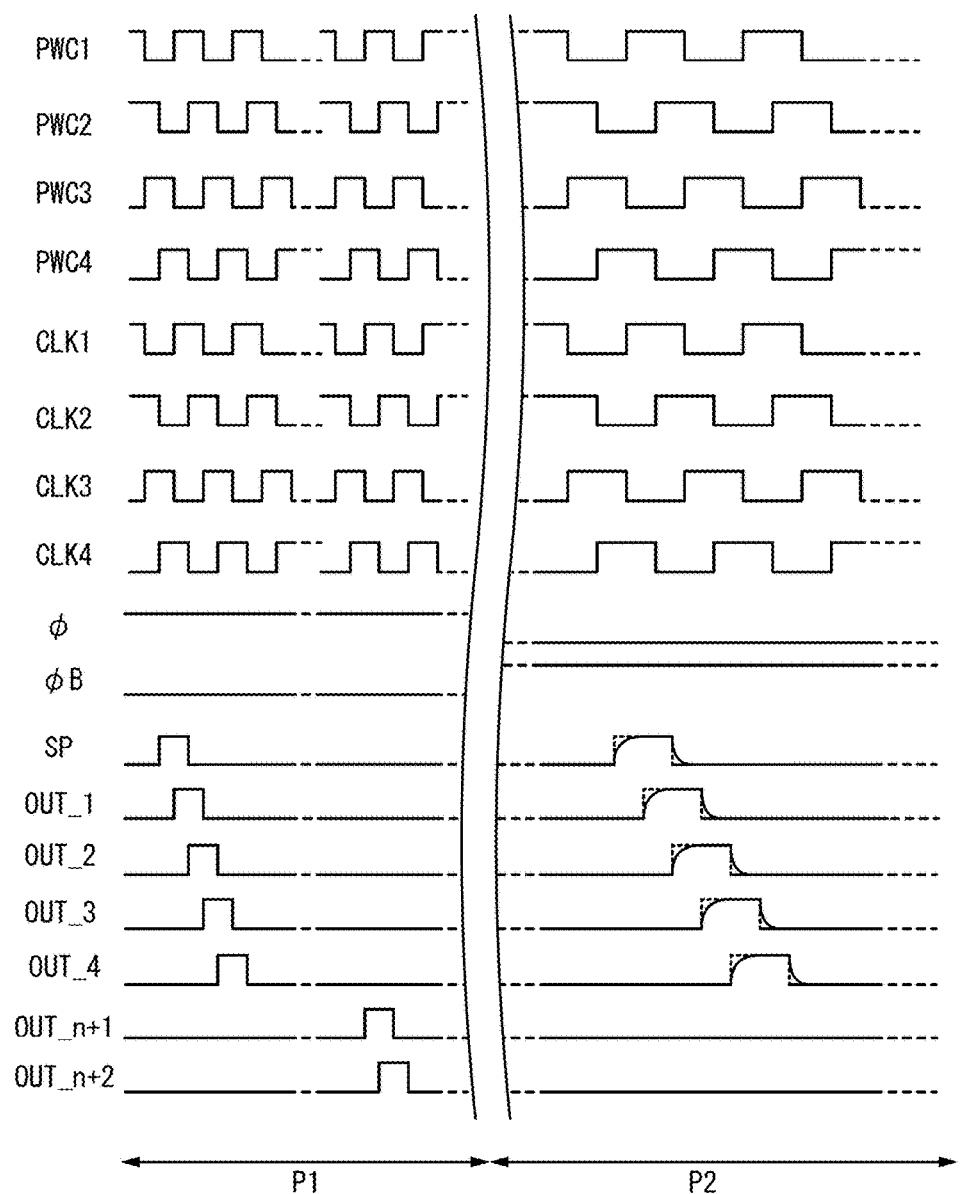

601  602  603

604

605a  605b 600  608  606  607

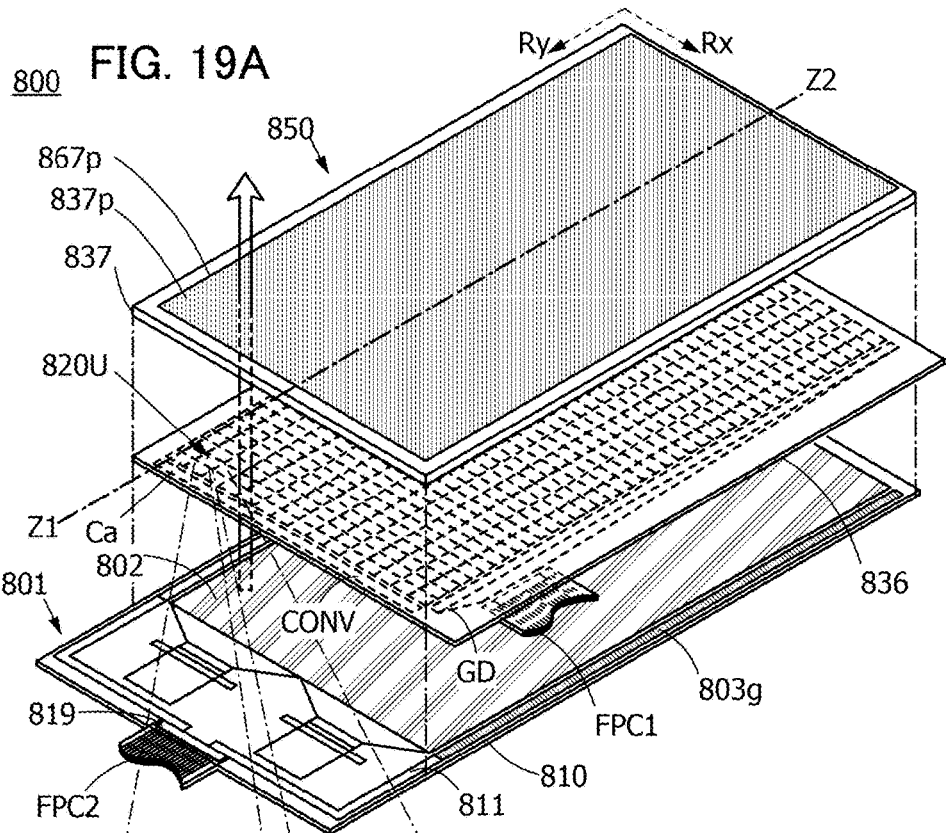
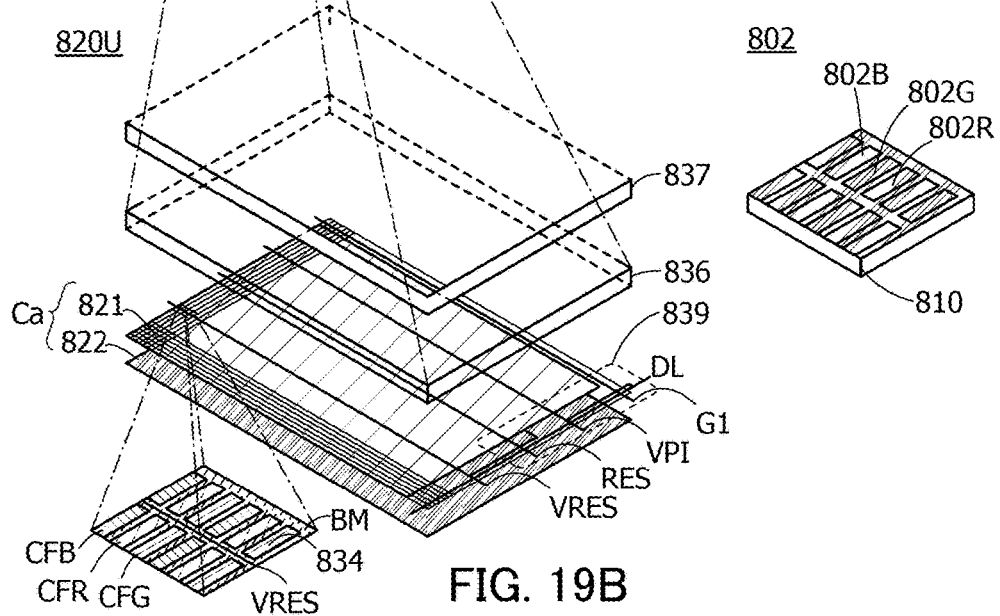

1400

1401  1402    1403

1410      1414 1412

1411
1415       1413

1420   1424
           1422
1421
       1423

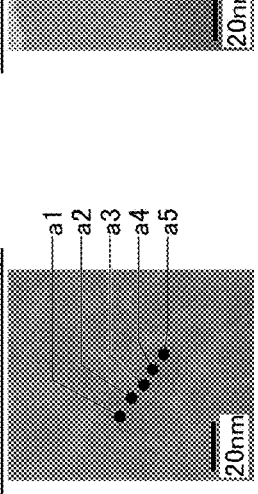
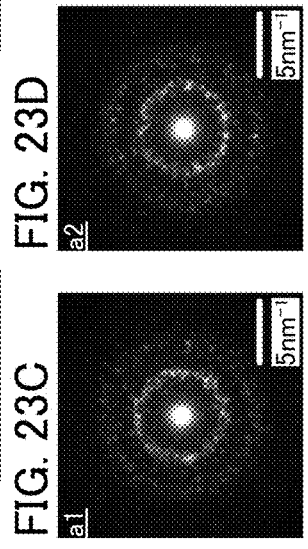
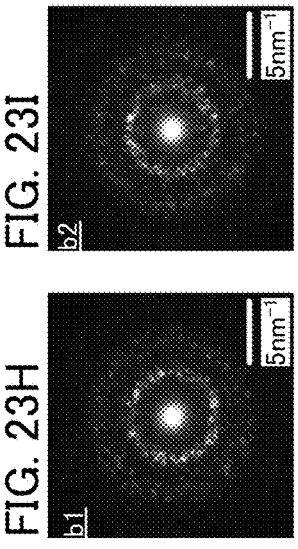

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display module, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

There has been a trend toward higher performance (e.g., narrower bezel width, multiple gray levels, and higher definition) of display devices. Driver circuits for realizing such high performance are required to have high dynamic characteristics (on-state characteristics or frequency characteristics (referred to as f characteristics)).

For example, Patent Documents 1 to 3 disclose semiconductor devices for higher dynamic characteristics, each having a structure in which a transistor in part of driver circuits are provided with gate electrodes over and under a semiconductor layer (hereinafter referred to as a dual-gate transistor).

REFERENCE

Patent Document

[Patent Document 1] United States Patent Application Publication No. 2010/0102313
[Patent Document 2] United States Patent Application Publication No. 2010/0102314
[Patent Document 3] United States Patent Application Publication No. 2010/0301326

SUMMARY OF THE INVENTION

As described above, there are many structures for a semiconductor device. The structures have merits and demerits, and an appropriate structure is selected in accordance with circumstances. Therefore, a proposal of a semiconductor device with a novel structure can expand the range of choices.

In view of the above, an object of one embodiment of the present invention is to provide a novel semiconductor device that has a structure different from that of an existing semiconductor device, a novel display module, a novel electronic device, or the like.

In a dual-gate transistor, voltage is applied to both of two gates (one is referred as a gate and the other is referred to as a backgate) to increase dynamic characteristics. However, when display does not require high dynamic characteristics, a transistor provided with a gate on only one side of a semiconductor layer (hereinafter referred to as a single-gate transistor) is, in some cases, preferable in terms of power consumption. In other words, a dual-gate transistor might have excessively high dynamic characteristics and consume extra power for operation.

Thus, it is an object of one embodiment of the present invention to provide a semiconductor device or the like having a novel structure, which can switch between a state in which the semiconductor device operates as a dual-gate transistor and a state in which the semiconductor device operates as a single-gate transistor. It is another object of one embodiment of the present invention to provide a semiconductor device or the like having a novel structure, which can reduce the consumed power necessary for charging and discharging a backgate depending on the state.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device which includes a first transistor, a second transistor, and a circuit. In the semiconductor device, a gate of the first transistor is electrically connected to a first input terminal, one of a source and a drain of the first transistor is electrically connected to a first wiring, and the other of the source and the drain of the first transistor is electrically connected to an output terminal. In addition, a gate of the second transistor is electrically connected to a second input terminal, one of a source and a drain of the second transistor is electrically connected to a second wiring, the other of the source and the drain of the second transistor is electrically connected to the output terminal, and the circuit switches between a first state in which the first input terminal and a backgate of the first transistor are electrically connected to each other and a second state in which the output terminal and the backgate of the first transistor are electrically connected to each other, in accordance with a control signal.

In the semiconductor device of one embodiment of the present invention, it is preferable that the circuit include a first switch and a second switch and that the control signal turn on or off the first switch and the second switch in turn to switch between the first state and the second state.

In the semiconductor device of one embodiment of the present invention, it is preferable that the first switch and the second switch are transistors.

In the semiconductor device of one embodiment of the present invention, it is preferable that the second transistor include a backgate electrically connected to the second input terminal.

The semiconductor device of one embodiment of the present invention preferably further include a third transistor which is between the input terminal and the gate of the first transistor. In addition, it is preferable that a gate of the third transistor is electrically connected to a wiring to which a high potential is supplied.

Note that other embodiments of the present invention will be described in the following embodiments with reference to the drawings.

One embodiment of the present invention can provide a novel semiconductor device, a novel display module, a novel electronic device, or the like.

Further, one embodiment of the present invention can provide a semiconductor device or the like having a novel structure, which can switch between a state in which the semiconductor device operates as a dual-gate transistor and a state in which the semiconductor device operates as a single-gate transistor. Furthermore, one embodiment of the present invention can provide a semiconductor device or the like having a novel structure, which can reduce the consumed power necessary for charging and discharging a backgate depending on the state.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIGS. 10A and 10B are circuit diagrams each illustrating one embodiment of the present invention;

FIG. 11 is a timing chart for explaining one embodiment of the present invention;

FIGS. 19A to 19C are projection views illustrating one embodiment of the present invention;

FIGS. 23A and 23B are TEM images of samples and FIGS. 23C to 23L are electron diffraction patterns thereof.

DETAILED DESCRIPTION OF THE INVENTION

Figure 1A:
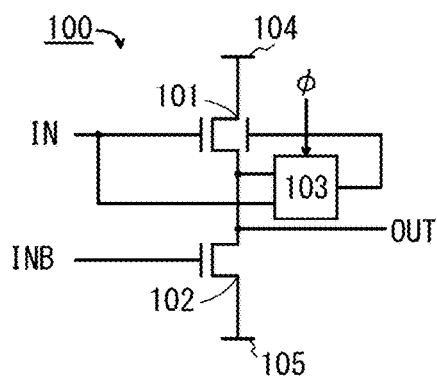
FIGS. 1A to 1D are circuit diagrams and a timing chart for explaining one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components.

The same elements or elements having similar functions, elements formed using the same material, elements formed at the same time, or the like in the drawings are denoted by the same reference numerals, and the description thereof is not repeated in some cases.

Embodiment 1

In this embodiment, an example of a semiconductor device will be described.

FIG. 1A is a circuit diagram illustrating a semiconductor device 100. The semiconductor device 100 can be used in part of a driver circuit of a display device.

The semiconductor device 100 illustrated in FIG. 1A includes a transistor 101, a transistor 102, and a switching circuit 103. Furthermore, an input terminal IN, an input terminal INB, an output terminal OUT, a wiring 104, and a wiring 105 are illustrated in FIG. 1A.

The transistor 101 controls a conduction state between a source and a drain, that is, a conduction state between the wiring 104 and the output terminal OUT. The transistor 101 is a dual-gate transistor including a gate and a backgate. The conduction state of the transistor 101 is controlled by a voltage of the input terminal IN applied to the gate and a voltage applied to the backgate. The following description is made on the assumption that the transistor 101 is an n-channel transistor.

The transistor 102 controls a conduction state between a source and a drain, that is, a conduction state between the wiring 105 and the output terminal OUT. The transistor 102 is a single-gate transistor including a gate. The conduction state of the transistor 102 is controlled by a voltage of the input terminal INB applied to the gate. The following description is made on the assumption that the transistor 102 is an n-channel transistor.

In accordance with a control signal ϕ, the switching circuit 103 can switch between a state in which the backgate of the transistor 101 and the input terminal IN are connected to each other and a state in which the backgate of the transistor 101 and the output terminal OUT are connected to each other. The switching circuit 103 may be simply referred to as a circuit.

An input signal supplied to the input terminal INB corresponds to an inverted signal of an input signal supplied to the input terminal IN, for example. A constant potential ($V_{DD}$) corresponding to a high potential is supplied to the wiring 104, for example. A constant potential (e.g., $V_{SS}$ or GND) corresponding to a low potential is supplied to the wiring 105, for example. A clock signal, a reset signal, or the like may be supplied to the wiring 104 or the wiring 105.

Figure 1B:
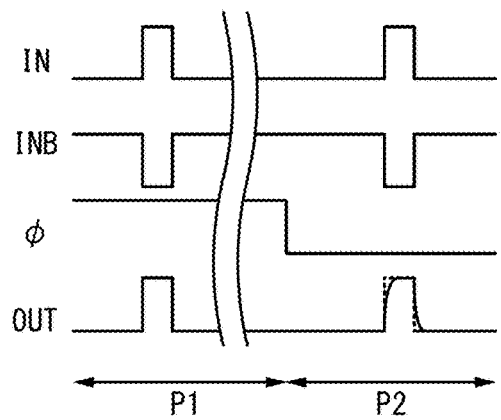

FIG. 1B is a timing chart for explaining the operation of the semiconductor device 100 illustrated in FIG. 1A. FIG. 1B shows a waveform at the input terminal IN, a waveform at the input terminal INB, a waveform of the control signal ϕ, and a waveform at the output terminal OUT. In FIG. 1B, the operation period is divided into a first period P1 and a second period P2 in accordance with the waveform of the signal.

As shown in FIG. 1B, the waveform at the input terminal IN and that at the input terminal INB have an inverted relationship. In the first period P1, the control signal ϕ is at the high (H) level. In the second period P2, the control signal ϕ is at the low (L) level. The waveform at the output terminal OUT changes depending on the potential or signal of the wiring 104 and the wiring 105. For example, when a constant potential corresponding to the high potential is supplied to the wiring 104 and a constant potential corresponding to the low potential is supplied to the wiring 105, the waveform at the output terminal OUT corresponds to that at the input terminal IN.

Figure 1C:
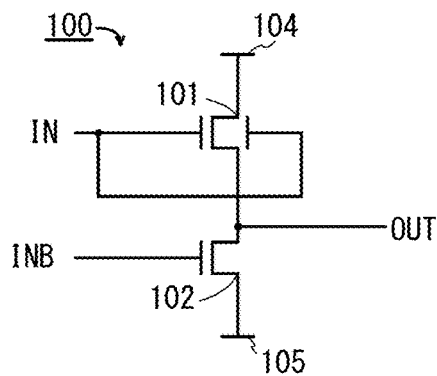
Figure 1D:
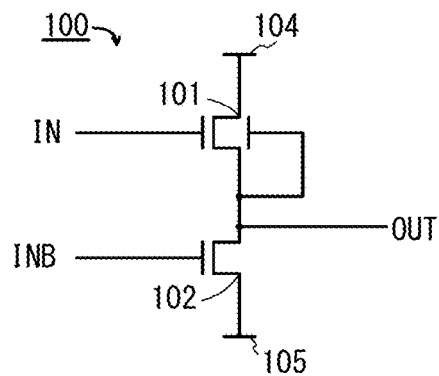

As described above, the switching circuit 103 switches the connection state in accordance with the control signal ϕ. In the first period P1, the backgate of the transistor 101 is connected to the input terminal IN, that is, a state illustrated in a circuit diagram of FIG. 1C is obtained. In the second period P2, the backgate of the transistor 101 is connected to the output terminal OUT, that is, a state illustrated in a circuit diagram of FIG. 1D is obtained.

In the circuit diagram of FIG. 1C, the transistor 101 operates as a dual-gate transistor, so that operation with high dynamic characteristics (on-state characteristics or frequency characteristics (referred to as f characteristics)) is possible. Accordingly, as shown in the first period P1 in FIG. 1B, the waveform at the output terminal OUT can be similar to that at the input terminal IN. In contrast, in the circuit diagram of FIG. 1D, the transistor 101 operates as a single-gate transistor, so that operation with low dynamic characteristics is possible. Accordingly, as shown in the second period P2 in FIG. 1B, the waveform at the output terminal OUT (solid line) can be distorted from the waveform at the input terminal IN (dotted line).

Differences between the operation in FIG. 1C and the operation in FIG. 1D can be explained with reference to circuit diagrams of FIGS. 2A to 2D. The high-level potential and the low-level potential of signals supplied to the input terminals IN and INB and the output terminal OUT in FIGS. 2A to 2D are expressed by "H" and "L." In FIGS. 2A to 2D, positive charges and negative charges accumulated in the gate and the backgate by application of a high-level potential or a low-level potential to the transistors are schematically illustrated. Furthermore, $V_{DD}$ and $V_{SS}$ are applied to the wiring 104 and the wiring 105, respectively, in FIGS. 2A to 2D.

Figure 2A:
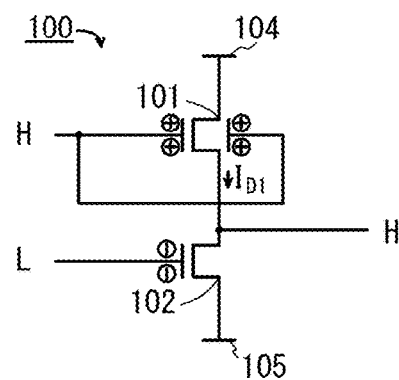
FIGS. 2A to 2D are circuit diagrams illustrating one embodiment of the present invention.
Figure 2B:
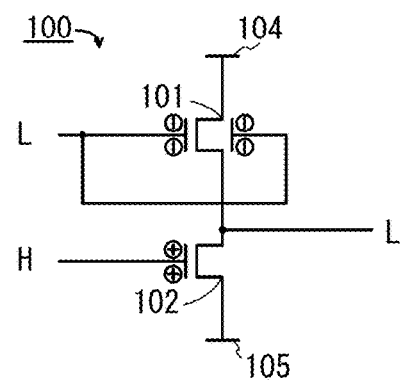

FIGS. 2A and 2B are schematic views in which the transistor 101 operates as a dual-gate transistor.

FIG. 2A schematically illustrates positive charges and negative charges accumulated in the gates and the backgate at the time when the potential of the input terminal IN is at the high level and the potential of the input terminal INB is at the low level. The transistor 101 is positively charged by the potential of the input terminal IN, so that the transistor 101 is brought into a conducting state, flowing a current $I_{D1}$. The transistor 102 is negatively charged by the potential of the input terminal INB, so that the transistor 102 is brought into a non-conducting state. The potential of the output terminal OUT is at the high level.

FIG. 2B schematically illustrates positive charges and negative charges accumulated in the gates and the backgate at the time when the potential of the input terminal IN is at the low level and the potential of the input terminal INB is at the high level. The transistor 101 is negatively charged by the potential of the input terminal IN, so that the transistor 101 is brought into a non-conducting state. The transistor 102 is positively charged by the potential of the input terminal INB, so that the transistor 102 is brought into a conducting state. The potential of the output terminal OUT is at the low level.

In the operation as a dual-gate transistor as illustrated in FIGS. 2A and 2B, positive charges or negative charges are accumulated in the gate and the backgate of the transistor 101; accordingly, an electric field is easily applied to a channel formation region. Thus, the current $I_{D1}$ can be large. Consequently, an operation with high dynamic characteristics can be performed.

Figure 2C:
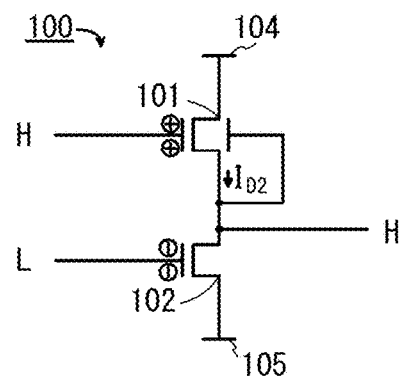
Figure 2D:
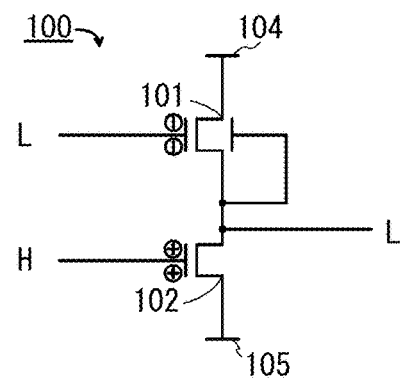

In contrast, FIGS. 2C and 2D are schematic views in which the transistor 101 operates as a single-gate transistor.

FIG. 2C schematically illustrates positive charges and negative charges accumulated in the gates at the time when the potential of the input terminal IN is at the high level and the potential of the input terminal INB is at the low level. The transistor 101 is positively charged by the potential of the input terminal IN, so that the transistor 101 is brought into a conducting state, flowing a current $I_{D2}$. The transistor 102 is negatively charged by the potential of the input terminal INB, so that the transistor 102 is brought into a non-conducting state. The potential of the output terminal OUT is at the high level.

FIG. 2D schematically illustrates positive charges and negative charges accumulated in the gates at the time when the potential of the input terminal IN is at the low level and the potential of the input terminal INB is at the high level. The transistor 101 is negatively charged by the potential of the input terminal IN, so that the transistor 101 is brought into a non-conducting state. The transistor 102 is positively charged by the potential of the input terminal INB, so that the transistor 102 is brought into a conducting state. The potential of the output terminal OUT is at the low level.

In the operation as a single-gate transistor as illustrated in FIGS. 2C and 2D, positive charges or negative charges from the input terminal IN are accumulated in one of the gates of the transistor 101; accordingly, an electric field is not easily applied to the channel formation region compared with the operation as a dual-gate transistor. Thus, the current $I_{D2}$ can be smaller than the current $I_{D1}$. Consequently, an operation with low dynamic characteristics can be performed.

The semiconductor device of one embodiment of the present invention described above can switch between a state in which the transistor operates as a dual-gate transistor and a state in which the transistor operates as a single-gate transistor. Therefore, when display does not require high dynamic characteristics, the transistor can operate as a single-gate transistor, and when display requires high dynamic characteristics, the transistor can operate as a dual-gate transistor. The consumed power of a single-gate transistor can be lower than that of a dual-gate transistor by the amount needed to charge and discharge the backgate.

When display does not require high dynamic characteristics, the frame frequency of the display device might be set to be equal to or lower than a constant value (60 Hz), for example. When display requires high dynamic characteristics, operation might be performed by double-frame rate driving (120 Hz), quadruple-frame rate driving (240 Hz), or the like, for example. In the case where display is switched between a mode of watching a sports game and a mode of viewing a home page, a change in frame frequency is effective in reducing power consumption. Switching between the execution of charging or discharging of the backgate and the interruption thereof as in one embodiment of the present invention in accordance with the change in frame frequency is effective for a further reduction in power consumption.

Figure 3A:
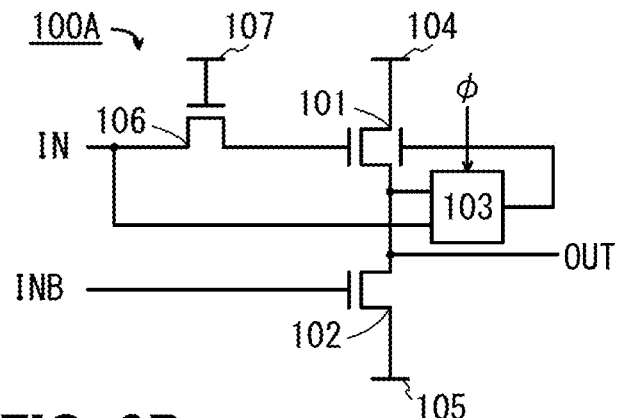
FIGS. 3A to 3C are circuit diagrams each illustrating one embodiment of the present invention.
Figure 3B:
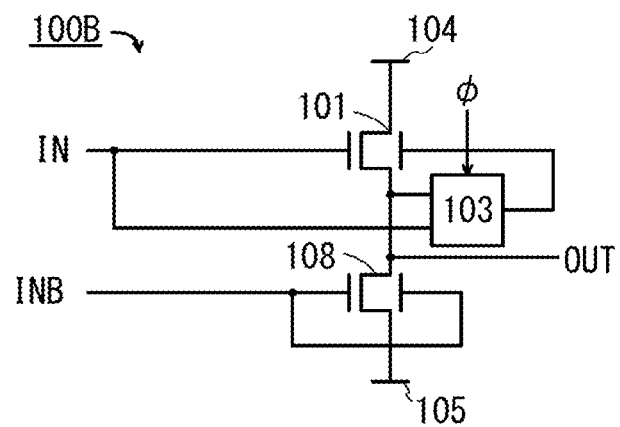
Figure 3C:
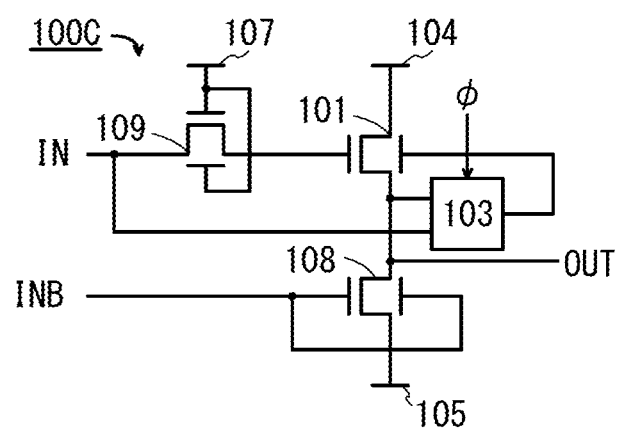

The semiconductor device 100 illustrated in FIG. 1A may be changed in a variety of ways. FIGS. 3A to 3C illustrate examples of the change.

A semiconductor device 100A illustrated in FIG. 3A is an example in which a transistor 106 is provided between the input terminal IN and the gate of the transistor 101. A wiring 107 is connected to a gate of the transistor 106. The potential of the wiring 107 is preferably a constant potential corresponding to a high potential. The structure of FIG. 3A enables a supply of a signal of the input terminal IN to the gate of the transistor 106 and can prevent an increase in the potential of the input terminal IN when the potential of the gate of the transistor 101 is increased owing to capacitive coupling caused by parasitic capacitance or the like between the gate of the transistor 101 and the output terminal OUT.

A semiconductor device 100B illustrated in FIG. 3B is an example in which a dual-gate transistor 108 is provided instead of the transistor 102. In this structure, the transistor 108 can have high dynamic characteristics.

The changes described with reference to FIGS. 3A and 3B can be combined. In this case, a semiconductor device 100C illustrated in FIG. 3C can be obtained. In FIG. 3C, a dual-gate transistor 109 serves as the transistor 106i illustrated in FIG. 3A and the dual-gate transistor 108 serves as the transistor 102. In this structure, the transistor 109 and the transistor 108 can have high dynamic characteristics.

Figure 4A:
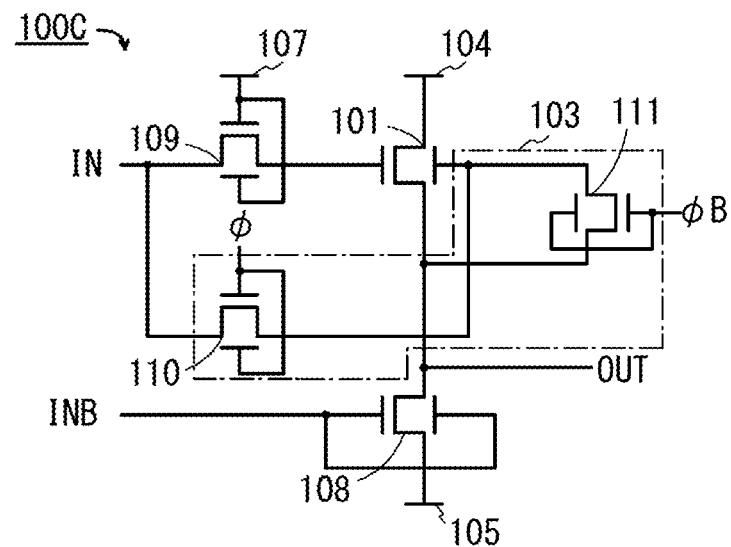
FIGS. 4A and 4B are a circuit diagram and a timing chart for explaining one embodiment of the present invention.

FIG. 4A illustrates an example of a specific circuit structure of the switching circuit 103 based on the semiconductor device 100C illustrated in FIG. 3C.

The switching circuit 103 includes a transistor 110 and a transistor 111. The transistor 110 and the transistor 111 are illustrated as dual-gate transistors. The transistor 110 controls a conduction state between a source and a drain, that is, a conduction state between the backgate of the transistor 101 and the input terminal IN. The transistor 111 controls a conduction state between a source and a drain, that is, a conduction state between the backgate of the transistor 101 and the output terminal OUT. The conduction state of the transistor 110 is controlled by the control signal φ. The conduction state of the transistor 111 is controlled by a control signal φB which corresponds to an inverted signal of the control signal φ. The description is made on the assumption that the transistor 110 and the transistor 111 are both n-channel transistors.

Figure 4B:
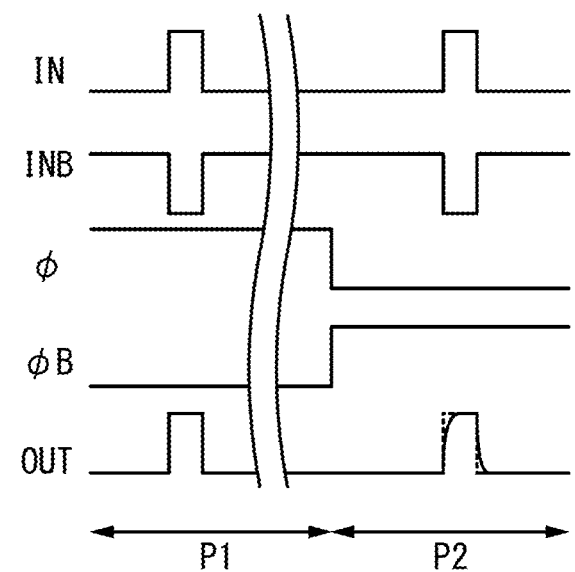

FIG. 4B is a timing chart for explaining the operation of the switching circuit 103 in the semiconductor device 100C illustrated in FIG. 4A. FIG. 4B shows a waveform at the input terminal IN, a waveform at the input terminal INB, a waveform of the control signal φ, a waveform of the control signal φB, and a waveform at the output terminal OUT. In a manner similar to that of FIG. 1B, the operation period in FIG. 4B is divided into a first period P1 and a second period P2.

As shown in FIG. 4B, the waveform of the control signal φ and that of the control signal φB have an inverted relationship. In the first period P1, the control signal φ is at the H level, and the control signal φB is at the L level. In the second period P2, the control signal φ is at the L level, and the control signal φB is at the H level.

As shown in FIG. 4B, by controlling the control signal φ and the control signal φB, the connection state of the switching circuit 103 is switched. In the first period P1, the backgate of the transistor 101 can be connected to the input terminal IN, that is, the transistor 101 can operate as a dual-gate transistor. In the second period P2, the backgate of the transistor 101 can be connected to the output terminal OUT, that is, the transistor 101 can operate as a single-gate transistor. Thus, dynamic characteristics of the transistor 101 can be changed. Accordingly, as shown by the second period P2 in FIG. 4B, the waveform at the output terminal OUT (solid line) can be distorted from the waveform at the input terminal IN (dotted line).

Figure 5A:
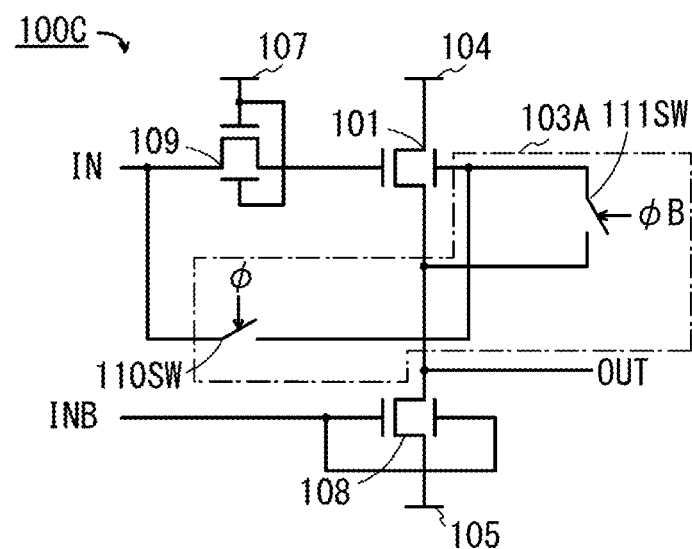
FIGS. 5A and 5B are circuit diagrams each illustrating one embodiment of the present invention.
Figure 5B:
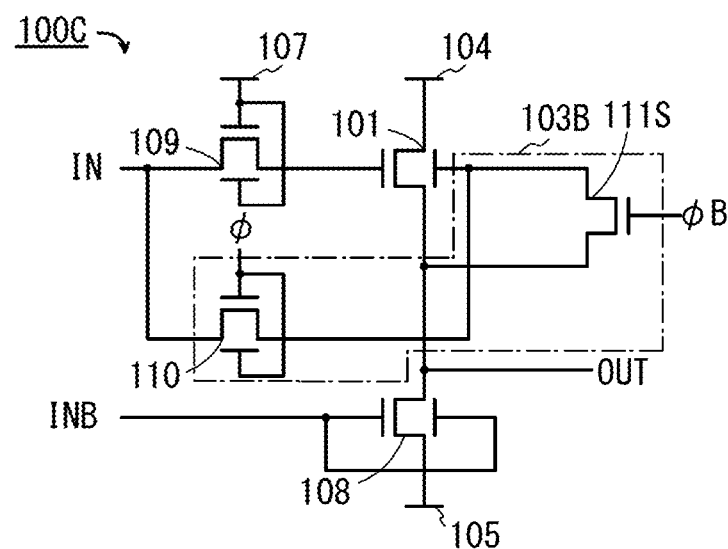

The switching circuit 103 illustrated in FIG. 4A may be changed in a variety of ways. FIGS. 5A and 5B illustrate examples of the change.

A switching circuit 103A included in the semiconductor device 100C illustrated in FIG. 5A is an example in which a switch 110SW and a switch 111SW are used as the transistor 110 and the transistor 111. Accordingly, the transistor 110 and the transistor 111 can be in a conducting state in turn.

A switching circuit 103B included in the semiconductor device 100C illustrated in FIG. 5B is an example in which a single-gate transistor 111S is used as the transistor 111. Thus, the transistor 110 and the transistor 111 can each have any of a dual-gate structure and a single-gate structure.

Figure 6:
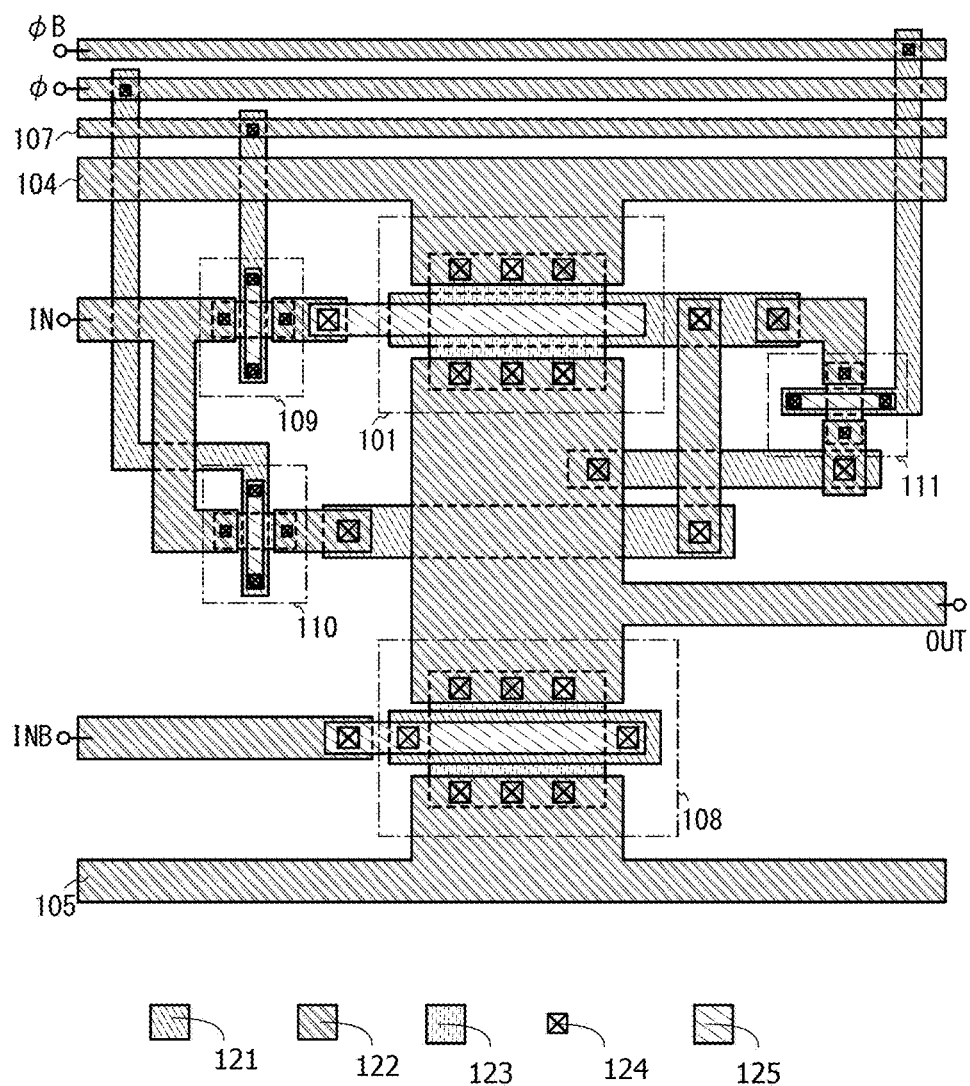
FIG. 6 is a top view illustrating one embodiment of the present invention.

FIG. 6 shows an example of a top view of the semiconductor device 100C based on the semiconductor device 100C illustrated in FIG. 4A. FIG. 6 illustrates a conductive layer 121, a conductive layer 122, a semiconductor layer 123, an opening 124, and a conductive layer 125 which are formed in order, to form transistors and wirings. Note that insulating layers or the like between conductive layers are not illustrated for simplicity.

FIG. 6 illustrates the transistor 101, the transistor 108, the transistor 109, the transistor 110, and the transistor 111 illustrated in FIG. 4A. Each of the transistors is a dual-gate transistor. Moreover, FIG. 6 illustrates the wiring 104, the wiring 105, the wiring 107, the input terminal IN, the input terminal INB, the output terminal OUT, and wirings through which the control signals φ and φB are supplied illustrated in FIG. 4A.

In the transistor 101 illustrated in FIG. 6, a conductive layer corresponding to the backgate is the conductive layer 121, and a conductive layer corresponding to the gate is the conductive layer 125. The conductive layer corresponding to the backgate has a larger width in the channel length direction than the conductive layer corresponding to the gate. With this structure, the effect of charging and discharging at the time when the structure is switched between the single-gate structure and the dual-gate structure can be enhanced. Furthermore, the transistors 110 and 111 included in the switching circuit 103 preferably have smaller transistor sizes than the transistors 101 and 108. Since the transistors 110 and 11 are only required to function as switches, the above-described structure enables a reduction in circuit area occupied by the transistors of the semiconductor device 100C.

Figure 7:
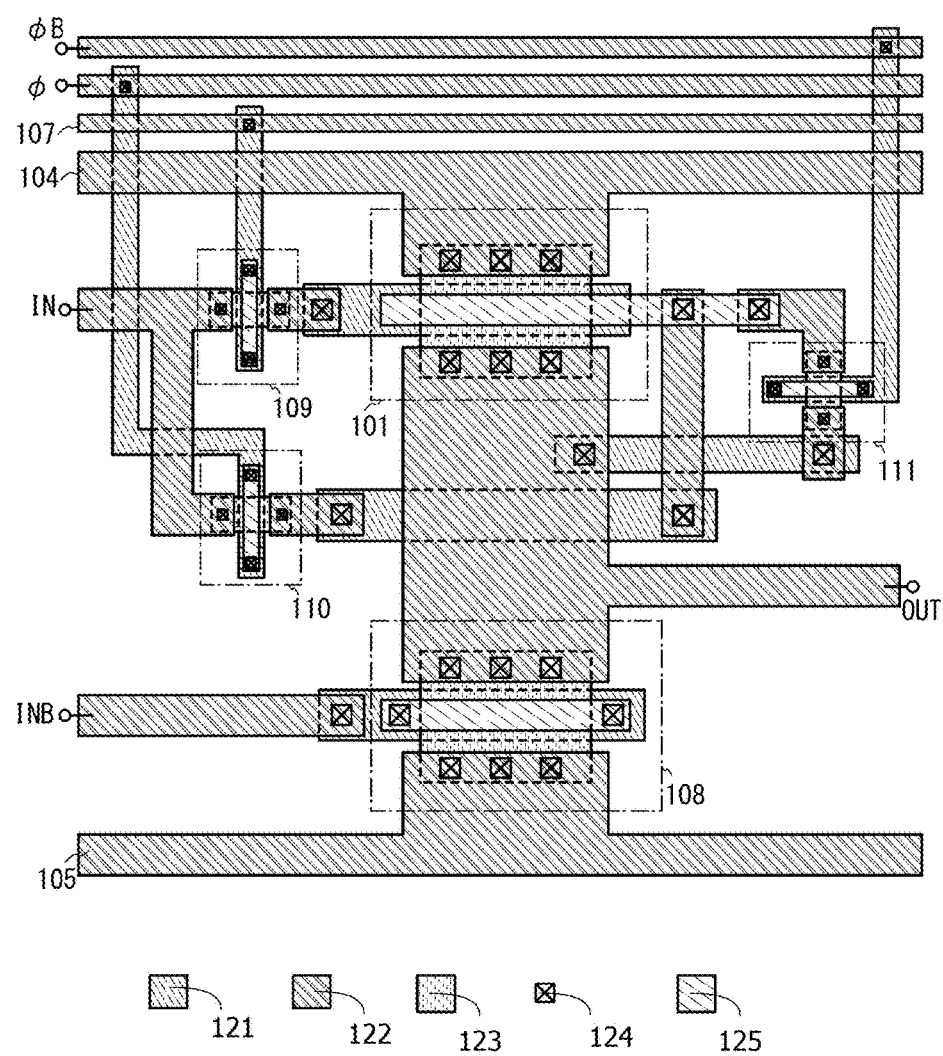
FIG. 7 is a top view illustrating one embodiment of the present invention.

Although the conductive layer corresponding to the backgate is illustrated as the conductive layer 121 provided below the conductive layer 125 which is the conductive layer corresponding to the gate in FIG. 6, the positional relation may be reversed vertically. For example, as illustrated in FIG. 7, the conductive layer corresponding to the backgate may be the conductive layer 125 and the conductive layer corresponding to the gate may be the conductive layer 121. With this structure, the conductive layer corresponding to the backgate can have a smaller width in the channel length direction than the conductive layer corresponding to the gate; accordingly, a reduction in dynamic characteristics at the time when the transistor has a single-gate structure can be prevented.

Next, structure examples for using a semiconductor device in a driver circuit of a display device are described with reference to FIGS. 8A and 8B, FIGS. 9A to 9C, FIGS. 10A and 10B, and FIG. 11 where a circuit 200 which supplies signals to the input terminal IN and the input terminal INB of the semiconductor device 100I illustrated in FIG. 4A is illustrated.

Figure 8A:
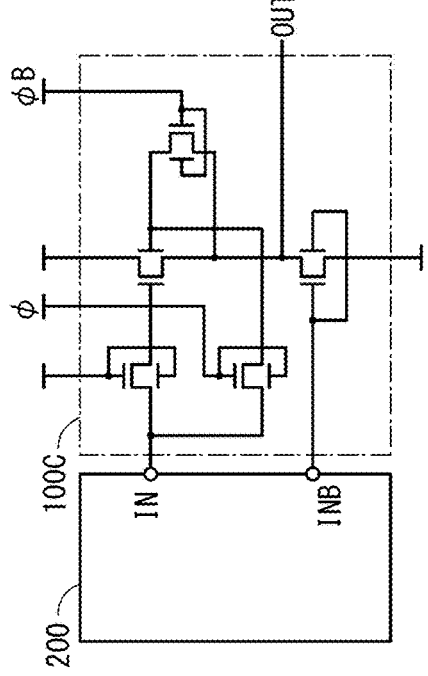
FIGS. 8A and 8B are circuit diagrams each illustrating one embodiment of the present invention.

The circuit 200 illustrated in FIG. 8A is connected to the input terminal IN and the input terminal INB. The semiconductor device 100C can function as a buffer which amplifies and outputs signals supplied to the input terminal IN and the input terminal INB.

Figure 8B:
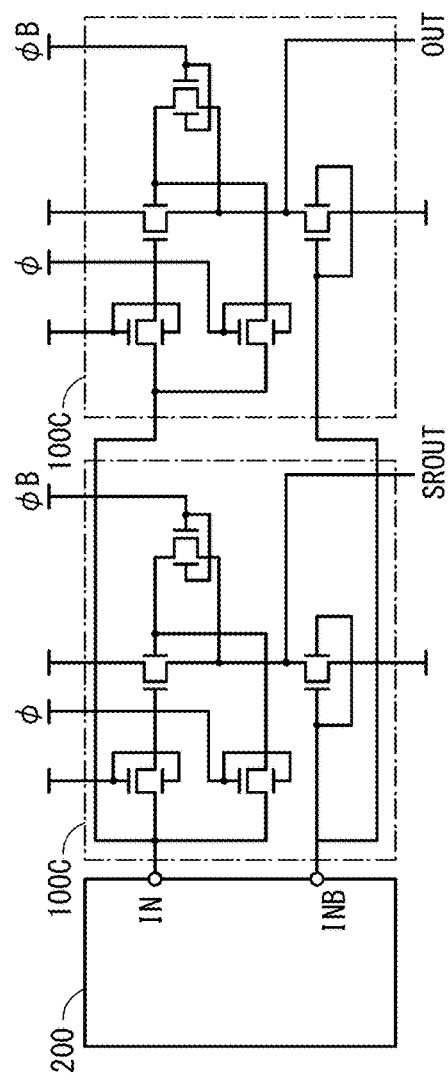

Note that the number of semiconductor devices 100C functioning as a buffer is not limited to one with respect to one circuit 200. A plurality of semiconductor devices 100C may be provided as illustrated in FIG. 8B. In this case, an output terminal SROUT and the output terminal OUT are preferably provided separately to correspond to connected different circuits. With this structure, the size of transistors included in the buffer can be changed in accordance with the load of the connected circuit, which enables a size reduction and a size design fitted to the load.

Next, a specific example of the circuit 200 described with reference to FIGS. 8A and 8B is described. A combination of the circuit 200 which controls timing of signals supplied to the input terminal IN and the input terminal INB and the semiconductor device 100C functioning as a buffer can function as a circuit of a one-stage shift register.

Figure 9A:
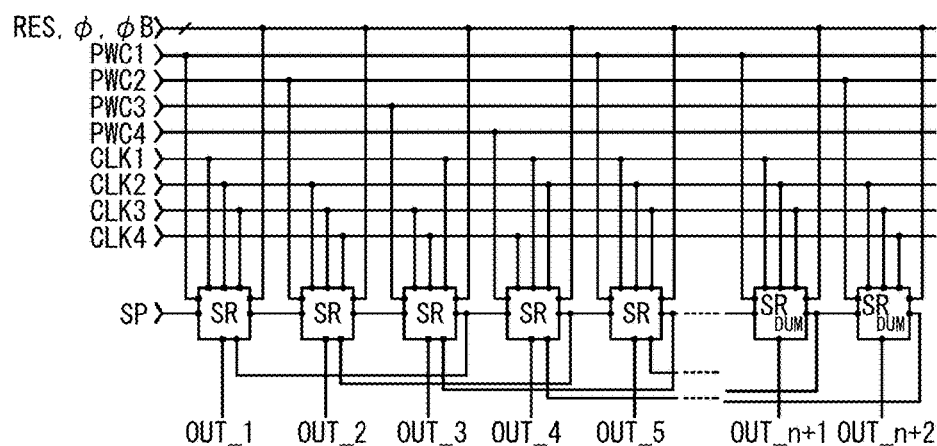
FIGS. 9A to 9C are circuit diagrams illustrating one embodiment of the present invention.

FIG. 9A illustrates an example of a circuit configuration of a shift register that can output (n+2) pulses. Circuits SR and circuit $SR_{DUM}$ correspond to a combination circuit of the circuit 200 and the semiconductor device 100C. The shift register in FIG. 9A can output pulses to output terminals OUT_1 to OUT_n+2 (n is a natural number) in accordance with a start pulse, clock signals CLK1 to CLK4, pulse width control signals PWC1 to PWC4, a reset signal RES, and the control signals φ and φB input from the outside. Although not illustrated, the reset signal RES and the control signals φ and φB are signals supplied to different wirings.

Figure 9B:
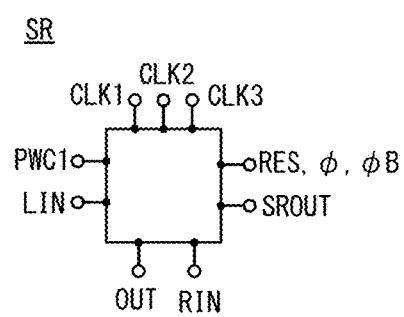
Figure 9C:
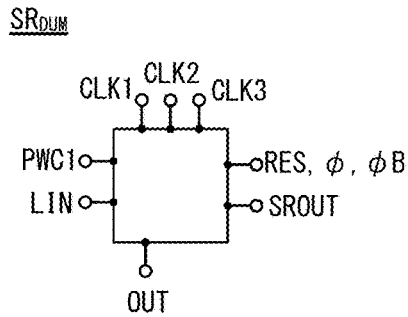

Signals shown in FIG. 9B are supplied to the circuits SR. Signals shown in FIG. 9C are supplied to the circuits $SR_{DUM}$. The clock signal (the clock signals CLK1 to CLK4) and the pulse width control signal (PWC1 to PWC4) supplied to the circuits SR and the circuits $SR_{DUM}$ are different depending on the stage. Note that LIN is a signal supplied from the upper stage of the shift direction in the shift register. Furthermore, RIN is a signal supplied from the lower stage of the shift direction of the shift register. Moreover, SROUT is a signal supplied to the next-stage shift register. Furthermore, OUT is a signal supplied to a wiring serving as a load.

An example of the circuit configuration of the circuit SR is illustrated in FIG. 10A. The circuit 200 (illustrated in FIG. 10A includes transistors 201 to 209. Although the transistors 201 to 209 are illustrated as dual-gate transistors, they may be single-gate transistors. Similarly, an example of the circuit configuration of the circuit $SR_{DUM}$ is illustrated in FIG. 10B.

FIG. 11 is a timing chart showing waveforms of the pulse width control signals PWC1 to PWC4, the clock signals CLK1 to CLK4, the control signals φ and φB, the start pulse SP, and the output terminals OUT_1 to OUT_n+2. As can be understood from the waveforms of the control signals φ and φB, the first half period in the timing chart illustrated in FIG. 11 corresponds to the first period P1 shown in FIG. 1B, and the latter half period corresponds to the second period P2 shown in FIG. 1B.

In the first period P1, the frequencies of the pulse width control signals PWC1 to PWC4 and the clock signals CLK1 to CLK4 are high, and high dynamic characteristics are required in the buffer of the shift register. Accordingly, in the buffer circuit, the control signals φ and φB are supplied so that the transistor functions as a dual-gate transistor. In contrast, in the second period P2, the frequencies of the pulse width control signals PWC1 to PWC4 and the clock signals CLK1 to CLK4 are low, and high dynamic characteristics are not required in the buffer of the shift register. Dynamic characteristics are excessively high if the transistor functions as a dual-gate transistor at this time. Thus, the control signals φ and φB are supplied so that the transistor functions as a single-gate transistor in the buffer circuit.

In this manner, by switching the function of a transistor included in a buffer between a dual-gate structure and a single-gate structure in accordance with not only the change in the frame frequency but also the change in frequency of a clock signal or the like, the power consumption can be reduced by the amount of charging or discharging a backgate.

Embodiment 2

In this embodiment, a display device in which the semiconductor device of one embodiment of the present invention can be used is described.

Figure 12A:
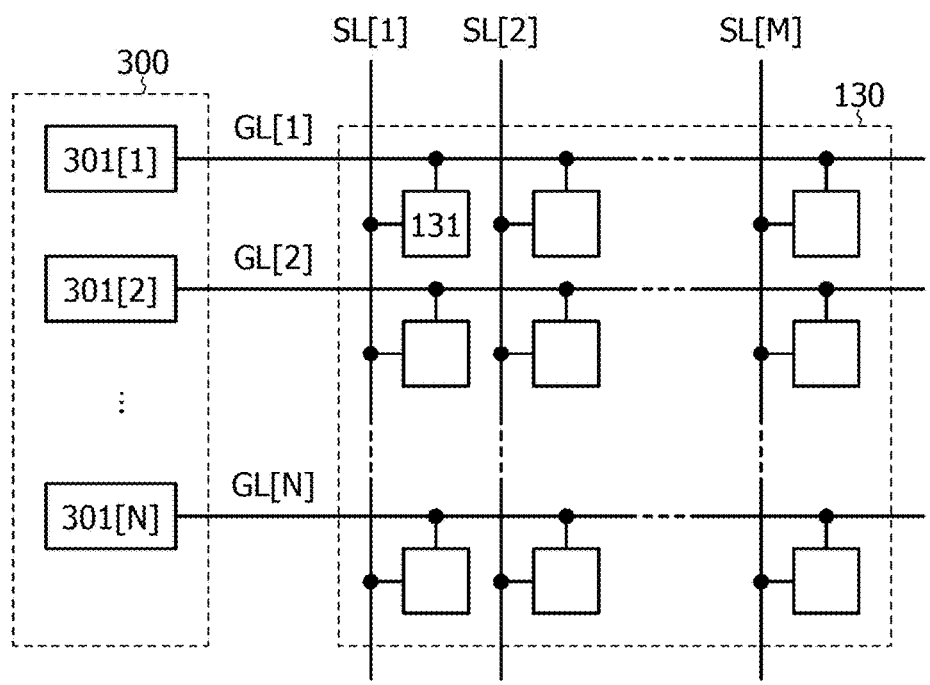
FIGS. 12A to 12C are circuit diagrams each illustrating one embodiment of the present invention.

A display device illustrated in FIG. 12A includes a circuit 300 and a pixel portion 130. In the pixel portion 130, N (N is a natural number of 3 or more) wirings GL (GL[1] to GL[N]) and M (M is a natural number) wirings SL (also referred to as wirings SL[1] to SL[M]) are provided. Pixels 131 are provided for the N wirings GL and M wirings SL. The circuit 300 has a function of a gate driver (also referred to as a gate line driver circuit, a gate signal line driver circuit, or a scan line driver circuit). The N wirings GL have a function of gate lines (also referred to as gate signal lines or scan lines). The M wirings SL have a function of transmitting video signals. That is, the M wirings SL have a function of source lines (also referred to as source signal lines or signal lines). The M wirings SL are connected to a circuit having a function of a source driver (also referred to as a source line driver circuit, a source signal line driver circuit, or a signal line driver circuit).

As the circuit 300, the shift register described in Embodiment 1 with reference to FIGS. 9A to 9C can be used. In that case, the N wirings GL correspond to the output terminals OUT_1 to OUT_n. As N circuits 301 (also referred to as circuits 301[1] to 301[N]) included in the circuit 300, the circuits SR and the circuits $SR_{DUM}$ described in Embodiment 1 can be used.

The selection and non-selection of the pixel 131 are controlled based on the potential of the wiring GL. That is, the selection and non-selection of the pixel 131 are controlled with the circuit 300. When the pixel 131 is selected, a video signal is written from the wiring SL to the pixel 131. While the video signal is held in the pixel 131, the pixel 131 displays an image in accordance with the video signal. After that, when the pixel 131 is not selected, the pixel 131 keeps displaying the image in accordance with the held video signal.

Next, a specific structure example of the pixel 131 is described.

Figure 12B:
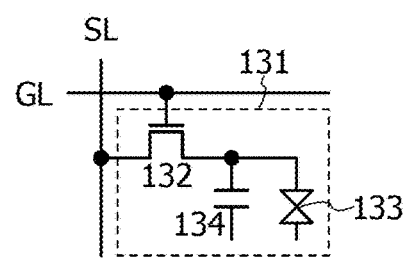

The pixel 131 illustrated in FIG. 12B includes a transistor 132, a liquid crystal element 133, and a capacitor 134. A first terminal of the transistor 132 is connected to the wiring SL, a second terminal of the transistor 132 is connected to a first electrode (also referred to as a pixel electrode) of the liquid crystal element 133 and a first electrode of the capacitor 134, and a gate of the transistor 132 is connected to the wiring GL. A second electrode (also referred to as a common electrode) of the liquid crystal element 133 is shared by all or two or more of the plurality of pixels 131. In other words, a conductor including a region serving as the second electrode of the liquid crystal element 133 of a first pixel 131 includes a region serving as the second electrode of the liquid crystal element 133 of a second pixel 131. A second electrode of the capacitor 134 is connected to a wiring having a function of a capacitor line. The second electrode of the capacitor 134 is connected to the same wiring in all or two or more of the plurality of pixels 131. Note that the second electrode of the capacitor 134 may be connected to the second electrode of the liquid crystal element 133. On/off of the transistor 132 is controlled with the potential of the wiring GL. When the transistor 132 is turned on, a video signal of the wiring SL is input to the pixel 131. The liquid crystal element 133 includes a liquid crystal material. The alignment of the liquid crystal material is controlled with the potential difference between the first electrode of the liquid crystal element 133 and the second electrode of the liquid crystal element 133. The capacitor 134 has a function of accumulating electric charge based on the video signal. In other words, the capacitor 134 has a function of maintaining the potential of the first electrode of the liquid crystal element 133 at a value corresponding to the video signal.

Figure 12C:
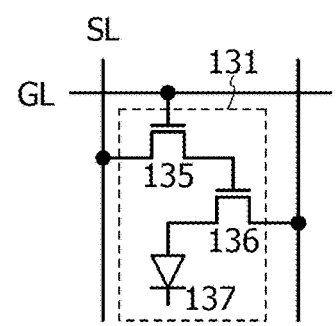

The pixel 131 illustrated in FIG. 12C includes a transistor 135, a transistor 136, and an EL element 137. A first terminal, a second terminal, and a gate of the transistor 135 are connected to the wiring SL, a gate of the transistor 136, and the wiring GL, respectively. A first terminal and a second terminal of the transistor 136 are connected to a wiring having a function of supplying a current flowing through the EL element 137 and a first electrode (also referred to as a pixel electrode) of the EL element 137, respectively. A second electrode (also referred to as a common electrode) of the EL element 137 is shared by all or two or more of the plurality of pixels 131. In other words, a conductor including a region serving as the second electrode of the EL element 137 of the first pixel 131 includes a region serving as the second electrode of the EL element 137 of the second pixel 131. On/off of the transistor 135 is controlled with the potential of the wiring GL. When the transistor 135 is turned on, the video signal of the wiring SL is input to the pixel 131. The transistor 136 has a function of supplying a current to the EL element 137. The current supplied to the EL element 137 by the transistor 136 has a value corresponding to the video signal. The EL element 137 has a function of emitting light in accordance with the current supplied from the transistor 136.

The structure of the pixel 131 is not limited to those in FIGS. 12B and 12C. The pixel 131 has any structure as long as it includes a transistor whose gate is connected to the wiring GL and first terminal is connected to the wiring SL and a display element which displays an image on the basis of a video signal input through the transistor. Alternatively, the pixel 131 has any structure as long as it includes a transistor whose gate is connected to the wiring GL and first terminal is connected to the wiring SL and a pixel electrode to which a potential or a current based on a video signal input through the transistor is supplied. Alternatively, the pixel 131 has any structure as long as it includes a transistor whose gate is connected to the wiring GL and first terminal is connected to the wiring SL and a transistor which supplies a current based on a video signal input through the transistor to a display element or a pixel electrode. The transistor included in the pixel may be a single-gate transistor or a dual-gate transistor.

Embodiment 3

In this embodiment, structure examples of a transistor that can be used as the transistors in each of the semiconductor devices described in Embodiment 1 will be described with reference to drawings.

<Structural Example of Transistor>

Figure 13A:
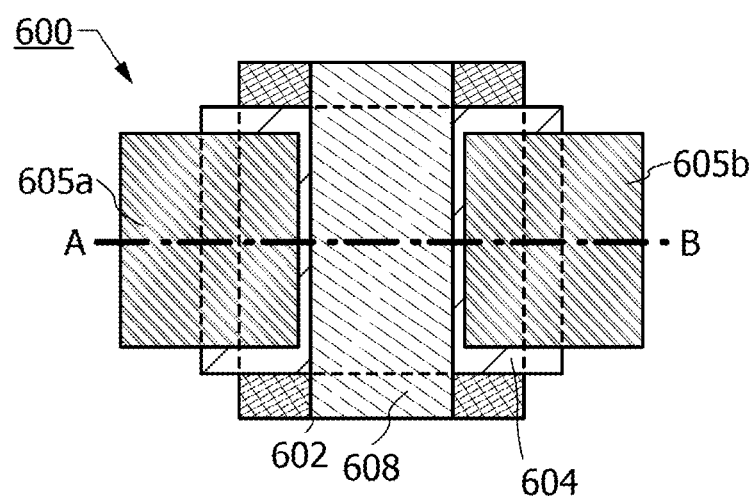
FIGS. 13A and 13B are a top view and a cross-sectional view illustrating one embodiment of the present invention.
Figure 13B:
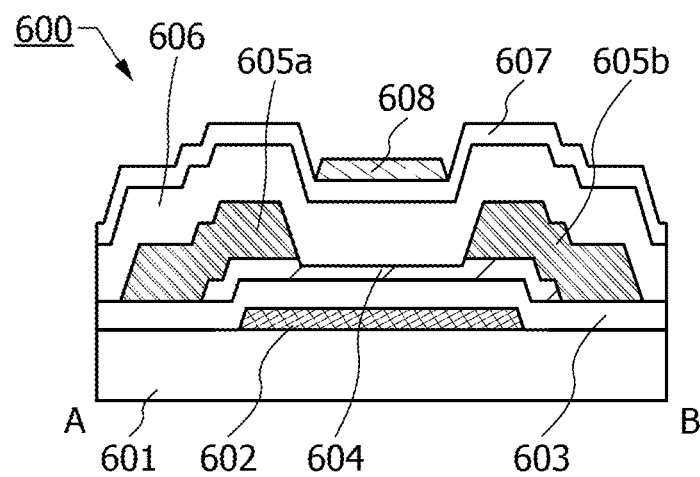

FIG. 13A is a schematic top view of a transistor 600 described below as an example. FIG. 13B is a schematic cross-sectional view of the transistor 600 taken along line A-B in FIG. 13A.

The transistor 600 includes a gate 602 over a substrate 601, an insulating layer 603 over the substrate 601 and the gate 602, an oxide semiconductor layer 604 provided over the insulating layer 603 to overlap with the gate 602, and a pair of electrodes 605a and 605b in contact with a top surface of the oxide semiconductor layer 604. An insulating layer 606 covers the insulating layer 603, the oxide semiconductor layer 604, and the pair of electrodes 605a and 605b. An insulating layer 607 is provided over the insulating layer 606. A backgate 608 is provided over the insulating layer 607.

There is no particular limitation on the properties of a material and the like of the substrate 601 as long as the material has heat resistance high enough to withstand at least heat treatment performed later. For example, a glass substrate, a ceramic substrate, a quartz substrate, a sapphire substrate, or an yttria-stabilized zirconia (YSZ) substrate may be used as the substrate 601. Alternatively, a single crystal semiconductor substrate or a polycrystalline semiconductor substrate made of silicon or silicon carbide, a compound semiconductor substrate made of silicon germanium, an SOI substrate, or the like can be used as the substrate 601. Still alternatively, any of these substrates provided with a semiconductor element may be used as the substrate 601.

A flexible substrate such as a plastic substrate may be used as the substrate 601, and the transistor 600 may be provided directly on the flexible substrate. Alternatively, a separation layer may be provided between the substrate 601 and the transistor 600. The separation layer can be used when part or the whole of the transistor formed over the separation layer is separated from the substrate 601 and transferred to another substrate. Thus, the transistor 600 can be transferred to a substrate having low heat resistance or a flexible substrate.

The gate 602 can be formed using a metal selected from aluminum, chromium, copper, tantalum, titanium, molybdenum, and tungsten; an alloy containing any of these metals as a component; an alloy containing any of these metals in combination; or the like. Furthermore, one or both of manganese and zirconium may be used. The gate 602 may have a single-layer structure or a stacked structure of two or more layers. For example, the gate 602 can have a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like. Alternatively, an alloy film or a nitride film that contains aluminum and one or more elements selected from titanium, tantalum, tungsten, molybdenum, chromium, neodymium, and scandium may be used.

The gate 602 and the backgate 608 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate 602 can have a stacked structure using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate 602 and the insulating layer 603. Materials of these films each have a work function of 5 eV or higher, preferably 5.5 eV or higher; thus, the threshold voltage of a transistor including such an oxide semiconductor film can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than at least the oxide semiconductor layer 604, specifically, an In—Ga—Zn-based oxynitride semiconductor film having a nitrogen concentration of 7 atomic % or higher is used.

The insulating layer 603 functions as a gate insulating film. The insulating layer 603 in contact with a bottom surface of the oxide semiconductor layer 604 is preferably an oxide insulating film.

The insulating layer 603 has a single-layer structure or a stacked structure using silicon oxide, silicon oxynitride, silicon nitride oxide, silicon nitride, aluminum oxide, hafnium oxide, gallium oxide, or Ga—Zn-based metal oxide, for example.

The insulating layer 603 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, in which case gate leakage current of the transistor can be reduced.

The pair of electrodes 605a and 605b function as a source electrode and a drain electrode of the transistor.

The pair of electrodes 605a and 605b can be formed to have a single-layer structure or a stacked structure using, as a conductive material, any of metals such as aluminum, titanium, chromium, nickel, copper, yttrium, zirconium, molybdenum, silver, tantalum, and tungsten or an alloy containing any of these metals as its main component. For example, the pair of electrodes 605a and 605b can have a single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

The insulating layer 606 is preferably an oxide insulating film which contains oxygen in excess of that in the stoichiometric composition. Part of oxygen is released by heating from the oxide insulating film which contains oxygen in excess of that in the stoichiometric composition. The oxide insulating film which contains oxygen in excess of that in the stoichiometric composition is an oxide insulating film in which the amount of released oxygen converted into oxygen atoms is $1.0\times10^{18}$ atoms/cm$^3$ or more, preferably $3.0\times10^{20}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

As the insulating layer 606, a silicon oxide film, a silicon oxynitride film, or the like can be used.

Note that the insulating layer 606 also functions as a film that relieves damage to the oxide semiconductor layer 604 at the time of forming the insulating layer 607 later.

Moreover, an oxide film transmitting oxygen may be provided between the insulating layer 606 and the oxide semiconductor layer 604.

As the oxide film transmitting oxygen, a silicon oxide film, a silicon oxynitride film, or the like can be used. Note that in this specification, a "silicon oxynitride film" refers to a film that contains more oxygen than nitrogen, and a "silicon nitride oxide film" refers to a film that contains more nitrogen than oxygen.

The insulating layer 607 can be an insulating film having a blocking effect against oxygen, hydrogen, water, and the like. Providing the insulating layer 607 over the insulating layer 606 can prevent outward diffusion of oxygen from the oxide semiconductor layer 604 and entry of hydrogen, water, or the like into the oxide semiconductor layer 604 from the outside. Examples of the insulating film having a blocking effect against oxygen, hydrogen, water, and the like are a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

<Example of Method for Manufacturing Transistor>

Next, an example of a manufacturing method of the transistor 600 in FIGS. 13A and 13B is described.

Figure 14A:
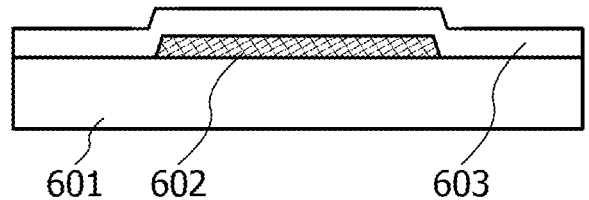
FIGS. 14A to 14D are cross-sectional views illustrating one embodiment of the present invention.

First, as illustrated in FIG. 14A, the gate 602 is formed over the substrate 601, and the insulating layer 603 is formed over the gate 602.

Here, a glass substrate is used as the substrate 601.

A method for forming the gate 602 is described below. First, a conductive film is formed by a sputtering method, a CVD method, an evaporation method, or the like and then a resist mask is formed over the conductive film by a photolithography process using a first photomask. Next, part of the conductive film is etched using the resist mask to form the gate 602. After that, the resist mask is removed.

Note that the gate 602 may be formed by an electrolytic plating method, a printing method, an inkjet method, or the like instead of the above formation method.

The insulating layer 603 is formed by a sputtering method, a PECVD method, an evaporation method, or the like.

When a silicon oxide film, a silicon oxynitride film, or a silicon nitride oxide film is formed as the insulating layer 603, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

When a silicon nitride film is formed as the insulating layer 603, it is preferable to use a two-step formation method. First, a first silicon nitride film with few defects is formed by a plasma CVD method using a mixed gas of silane, nitrogen, and ammonia as a source gas. Then, a second silicon nitride film that has low hydrogen concentration and can block hydrogen is formed by switching the source gas to a mixed gas of silane and nitrogen. With such a formation method, a silicon nitride film having few defects and a blocking property against hydrogen can be formed as the insulating layer 603.

When a gallium oxide film is formed as the insulating layer 603, a metal organic chemical vapor deposition (MOCVD) method can be employed.

Figure 14B:
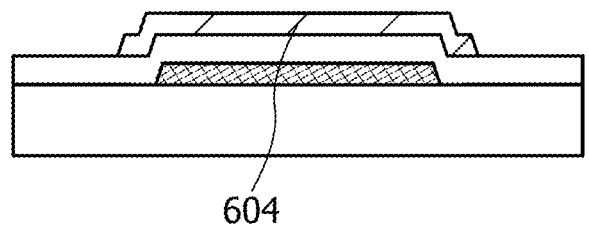

Next, as illustrated in FIG. 14B, the oxide semiconductor layer 604 is formed over the insulating layer 603.

A method for forming the oxide semiconductor layer 604 is described below. First, an oxide semiconductor film is formed. Then, a resist mask is formed over the oxide semiconductor film by a photolithography process using a second photomask. Then, part of the oxide semiconductor film is etched using the resist mask to form the oxide semiconductor layer 604. After that, the resist mask is removed.

After that, heat treatment may be performed. In such a case, the heat treatment is preferably performed under an atmosphere containing oxygen. The temperature of the heat treatment may be, for example, higher than or equal to 150° C. and lower than or equal to 600° C., preferably higher than or equal to 200° C. and lower than or equal to 500° C.

Figure 14C:
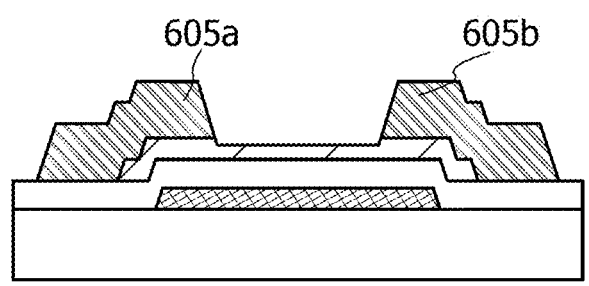

Next, as illustrated in FIG. 14C, the pair of electrodes 605a and 605b are formed.

A method for forming the pair of electrodes 605a and 605b is described below. First, a conductive film is formed by a sputtering method, a PECVD method, an evaporation method, or the like. Next, a resist mask is formed over the conductive film by a photolithography process using a third photomask. Then, part of the conductive film is etched using the resist mask to form the pair of electrodes 605a and 605b. After that, the resist mask is removed.

Note that as illustrated in FIG. 14C, the upper part of the oxide semiconductor layer 604 is partly etched and thinned by the etching of the conductive film in some cases. For this reason, the oxide semiconductor film is preferably formed thick.

Figure 14D:
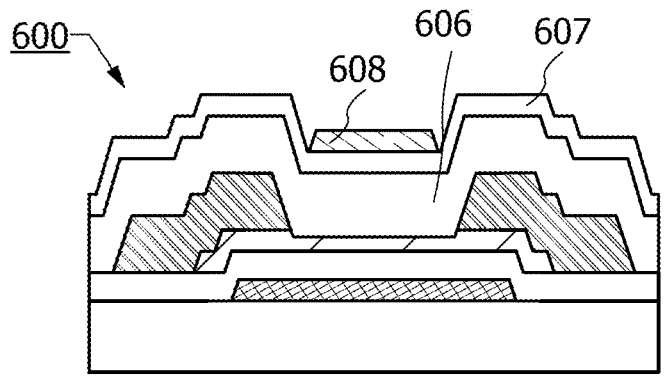

Next, as illustrated in FIG. 14D, the insulating layer 606 is formed over the oxide semiconductor layer 604 and the pair of electrodes 605a and 605b, and the insulating layer 607 is successively formed over the insulating layer 606. Then, the backgate 608 is successively formed over the insulating layer 607.

When a silicon oxide film or a silicon oxynitride film is formed as the insulating layer 606, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

For example, a silicon oxide film or a silicon oxynitride film is formed under the following conditions: the substrate placed in an vacuum-evacuated treatment chamber of a plasma CVD apparatus is held at a temperature ranging from 180° C. to 260° C., preferably from 200° C. to 240° C.; the pressure of the treatment chamber into which the source gas is introduced is set in the range from 100 Pa to 250 Pa, preferably from 100 Pa to 200 Pa; and an electrode provided in the treatment chamber is supplied with a high-frequency power ranging from 0.17 W/cm$^2$ to 0.5 W/cm$^2$, preferably from 0.25 W/cm$^2$ to 0.35 W/cm.

As the film formation conditions, the high-frequency power with the above power density is supplied to the treatment chamber having the above pressure, whereby the decomposition efficiency of the source gas in plasma is increased, oxygen radicals are increased, and oxidation of the source gas is promoted; therefore, the oxygen content in the oxide insulating film becomes higher than that in the stoichiometric composition. However, when the substrate temperature is within the above temperature range, the bond between silicon and oxygen is weak, and accordingly, part of oxygen is released by heating. Thus, it is possible to form an oxide insulating film which contains oxygen in excess of that in the stoichiometric composition and from which part of oxygen is released by heating.

In the case where an oxide insulating film is provided between the oxide semiconductor layer 604 and the insulating layer 606, the oxide insulating film serves as a protection film of the oxide semiconductor layer 604 in the step of forming the insulating layer 606. Thus, the insulating layer 606 can be formed using the high-frequency power with high power density while damage to the oxide semiconductor layer 604 is reduced.

For example, a silicon oxide film or a silicon oxynitride film can be formed as the oxide insulating film under the following conditions: the substrate placed in an vacuum-evacuated treatment chamber of the PECVD apparatus is held at a temperature ranging from 180° C. to 400° C., preferably from 200° C. to 370° C.; the pressure of the treatment chamber into which the source gas is introduced is set in the range from 20 Pa to 250 Pa, preferably from 100

Pa to 250 Pa; and high-frequency power is supplied to the electrode provided in the treatment chamber. Setting the pressure in the treatment chamber in the range from 100 Pa to 250 Pa can reduce damage to the oxide semiconductor layer 604 at the time of forming the oxide insulating film.

A deposition gas containing silicon and an oxidizing gas are preferably used as a source gas of the oxide insulating film. Typical examples of the deposition gas containing silicon are silane, disilane, trisilane, and silane fluoride. Examples of the oxidizing gas are oxygen, ozone, dinitrogen monoxide, and nitrogen dioxide.

The insulating layer 607 can be formed by a sputtering method, a PECVD method, or the like.

When a silicon nitride film or a silicon nitride oxide film is formed as the insulating layer 607, a deposition gas containing silicon, an oxidizing gas, and a gas containing nitrogen are preferably used as a source gas. Typical examples of the deposition gas containing silicon are silane, disilane, trisilane, and silane fluoride. Examples of the oxidizing gas are oxygen, ozone, dinitrogen monoxide, and nitrogen dioxide. Examples of the gas containing nitrogen are nitrogen and ammonia.

A formation method of the backgate 608 is described below. First, a conductive film is formed by a sputtering method, a CVD method, an evaporation method, or the like and then a resist mask is formed over the conductive film by a photolithography process using a fourth photomask. Then, part of the conductive film is etched using the resist mask to form the backgate 608. After that, the resist mask is removed.

Instead of the above formation method, the backgate 608 may be formed by an electrolytic plating method, a printing method, an ink-jet method, or the like.

Through the above steps, the transistor 600 can be formed.

<Variation of Transistor>

Examples of the structure of a transistor that is partly different from the transistor 600 are described below.

Figure 15A:
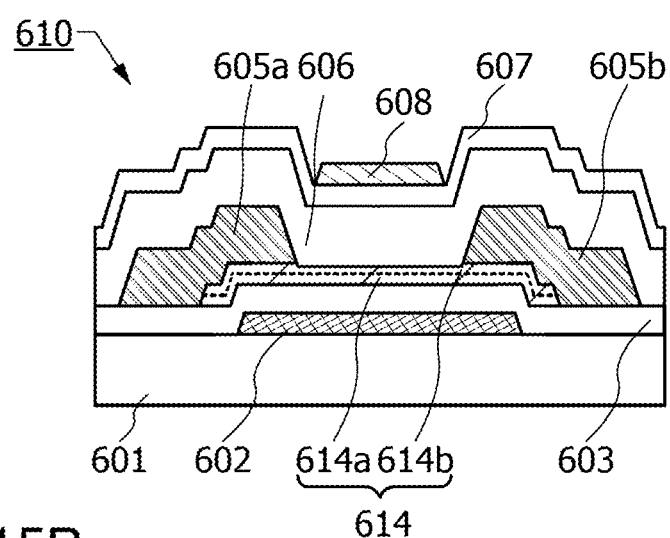
FIGS. 15A and 15B are cross-sectional views each illustrating one embodiment of the present invention.

FIG. 15A is a schematic cross-sectional diagram of a transistor 610 described below as an example. The transistor 610 differs from the transistor 600 in the structure of the oxide semiconductor layer.

An oxide semiconductor layer 614 included in the transistor 610 is a stack of an oxide semiconductor layer 614a and an oxide semiconductor layer 614b.

Note that a boundary between the oxide semiconductor layers 614a and 614b is shown by broken lines in FIG. 15A and the like because the boundary is not clear in some cases.

Typical examples of a material of the oxide semiconductor layer 614a are an In—Ga oxide, an In—Zn oxide, and an In-M-Zn oxide (M represents Al, Ti, Ga, Y, Zr, La, Ce, Nd, or Hf). When the oxide semiconductor layer 614a is In-M-Zn oxide, without taking Zn and O into consideration, the proportion of In and the proportion of Mare preferably set to less than 50 atomic % and greater than or equal to 50 atomic %, respectively, further preferably less than 25 atomic % and greater than or equal to 75 atomic %, respectively. For example, a material that has an energy gap of 2 eV or more, preferably 2.5 eV or more, further preferably 3 eV or more is used for the oxide semiconductor layer 614a.

The oxide semiconductor layer 614b contains In or Ga, and typically contains an In—Ga oxide, an In—Zn oxide, or an In-M-Zn oxide (M represents Al, Ti, Ga, Y, Zr, La, Ce, Nd, or Hf). The energy at the conduction band bottom of the oxide semiconductor layer 614b is closer to a vacuum level than that of the oxide semiconductor layer 614a, and typically, the difference in the energy at the conduction band bottom between the oxide semiconductor layer 614b and the oxide semiconductor layer 614a is preferably 0.05 eV or more, 0.07 eV or more, 0.1 eV or more, or 0.15 eV or more and 2 eV or less, 1 eV or less, 0.5 eV or less, or 0.4 eV or less.

For example, when the oxide semiconductor layer 614b is an In-M-Zn oxide, the proportion of In and the proportion of M, not taking Zn and O into consideration, are preferably greater than or equal to 25 atomic % and less than 75 atomic %, respectively, further preferably greater than or equal to 34 atomic % and less than 66 atomic %, respectively.

For example, for the oxide semiconductor layer 614a, an In—Ga—Zn oxide with an atomic ratio of In:Ga:Zn=1:1:1, 1.1:1.2, or 3:1:2 can be used. For the oxide semiconductor layer 614b, an In—Ga—Zn oxide with an atomic ratio of n:Ga:Zn=1:3:2, 1:6:4, or 1:9:6 can be used. Note that the atomic ratio of each of the oxide semiconductor layers 614a and 614b may vary within a margin of ±20% of the corresponding atomic ratio.

The oxide with a high content of Ga serving as a stabilizer is used for the oxide semiconductor layer 614b provided over the oxide semiconductor layer 614a, thereby preventing release of oxygen from the oxide semiconductor layers 614a and 614b.

Note that without limitation to the materials given above, a material with an appropriate composition depending on intended semiconductor characteristics and electrical characteristics (e.g., field-effect mobility and threshold voltage) of a transistor can be used. In order to obtain intended semiconductor characteristics of the transistor, it is preferable that the carrier density, the impurity concentration, the defect density, the atomic ratio of a metal element to oxygen, the interatomic distance, the density, and the like of each of the oxide semiconductor layers 614a and 614b be set to appropriate values.

Although the oxide semiconductor layer 614 is a stack of two oxide semiconductor layers in the above structure, it may be a stack of three or more oxide semiconductor layers.

Figure 15B:
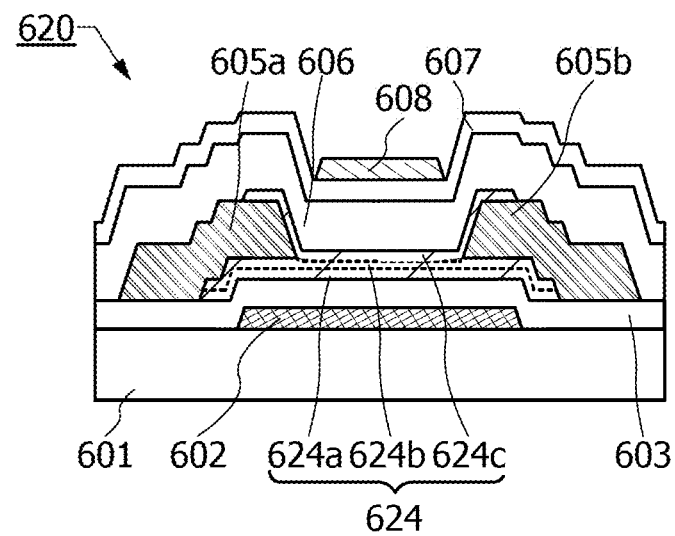

FIG. 15B is a schematic cross-sectional diagram of a transistor 620 described below as an example. The transistor 620 differs from the transistor 600 and the transistor 610 in the structure of the oxide semiconductor layer.

In an oxide semiconductor layer 624 included in the transistor 620, an oxide semiconductor layer 624a, an oxide semiconductor layer 624b, and an oxide semiconductor layer 624c are stacked in this order.

The oxide semiconductor layers 624a and 624b are stacked over the insulating layer 603. The oxide semiconductor layer 624c is provided in contact with a top surface of the oxide semiconductor layer 624b and top and side surfaces of the pair of electrodes 605a and 605b.

The oxide semiconductor layer 624b can have a structure similar to that of the oxide semiconductor layer 614a exemplified in <Variation of Transistor>, for example. Moreover, the oxide semiconductor layers 624a and 624c can have a structure similar to that of the oxide semiconductor layer 614b exemplified in <Variation of Transistor>, for example.

For example, when an oxide with a high content of Ga serving as a stabilizer is used for the oxide semiconductor layer 624a provided under the oxide semiconductor layer 624b and the oxide semiconductor layer 624c provided over the oxide semiconductor layer 624b, oxygen can be prevented from being released from the oxide semiconductor layers 624a to 624c.

For example, in the case where a channel is formed mainly in the oxide semiconductor layer 624b, the on-state current of the transistor 620 can be increased when an oxide with a high content of In is used for the oxide semiconductor layer 624b and the pair of electrodes 605a and 605b are provided in contact with the oxide semiconductor layer 624b.

<Other Structure Examples of Transistor>

Other structural examples in which an oxide semiconductor film can be used are described below.

Note that components having structures or functions similar to the above are denoted by the same reference numerals, and the description thereof is omitted below.

Figure 16A:
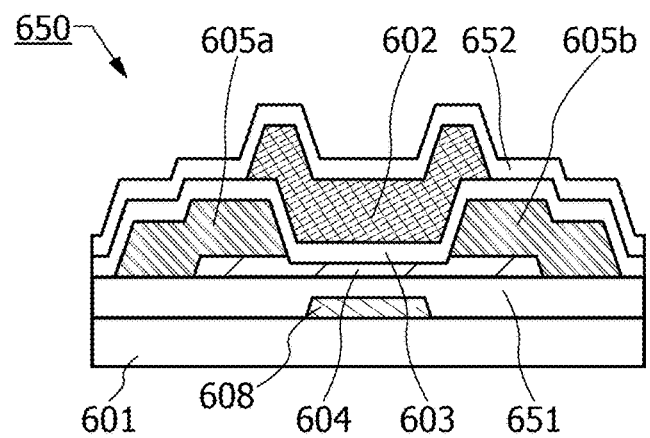
FIGS. 16A to 16C are cross-sectional views each illustrating one embodiment of the present invention.

FIG. 16A is a schematic cross-sectional diagram of a transistor 650 described below as an example.

The transistor 650 includes the backgate 608 over the substrate 601, the oxide semiconductor layer 604 over an insulating layer 651, the pair of electrodes 605a and 605b in contact with the top surface of the oxide semiconductor layer 604, the insulating layer 603 over the oxide semiconductor layer 604 and the pair of electrodes 605a and 605b, and the gate 602 provided over the insulating layer 603 so as to overlap with the oxide semiconductor layer 604. An insulating layer 652 is provided to cover the insulating layer 603 and the gate 602.

The insulating layer 651 has a function of suppressing diffusion of impurities from the substrate 601 to the oxide semiconductor layer 604. For example, a structure similar to that of the insulating layer 607 can be employed. Note that the insulating layer 651 is not necessarily provided.

Like the insulating layer 607, the insulating layer 652 can be an insulating film having a blocking effect against oxygen, hydrogen, water, and the like. Note that the insulating layer 607 is not necessarily provided.

Examples of the structure of a transistor that is partly different from the transistor 650 are described below.

Figure 16B:
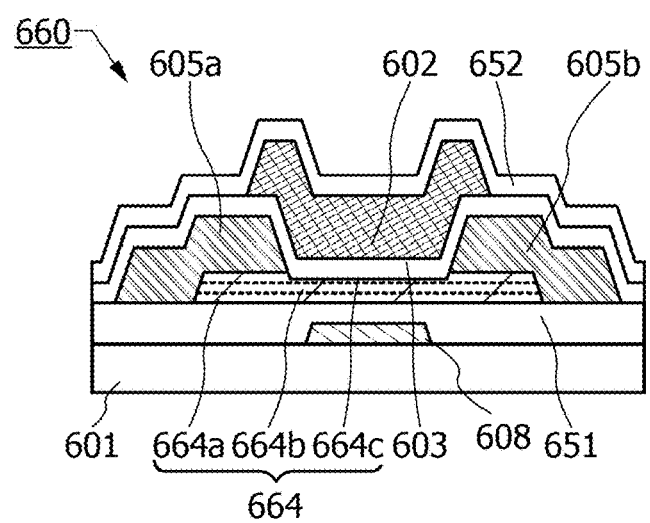

FIG. 16B is a schematic cross-sectional diagram of a transistor 660. The transistor 660 differs from the transistor 650 in the structure of the oxide semiconductor layer.

In an oxide semiconductor layer 664 included in the transistor 660, an oxide semiconductor layer 664a, an oxide semiconductor layer 664b, and an oxide semiconductor layer 664c are stacked in this order.

The oxide semiconductor film described above can be used as one or more of the oxide semiconductor layers 664a to 664c.

The oxide semiconductor layer 664b can have a structure similar to that of the oxide semiconductor layer 614a exemplified in <Variation of Transistor>, for example. The oxide semiconductor layers 664a and 664c can have a structure similar to that of the oxide semiconductor layer 614b exemplified in <Variation of Transistor>, for example.

For example, when an oxide with a high content of Ga serving as a stabilizer is used for the oxide semiconductor layer 664a provided under the oxide semiconductor layer 664b and the oxide semiconductor layer 664c provided over the oxide semiconductor layer 664b, oxygen can be prevented from being released from the oxide semiconductor layers 664a to 664c.

A structure example of a transistor, which is partly different from the transistor 650, is described below.

Figure 16C:
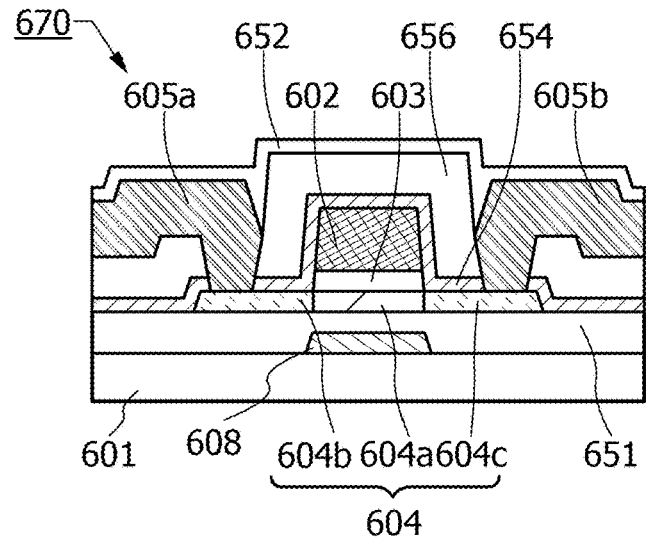

FIG. 16C is a schematic cross-sectional diagram of a transistor 670 exemplified below. The transistor 670 differs from the transistor 650 in the shapes of the pair of electrodes 605a and 605b in contact with the oxide semiconductor layer 604, the shape of the gate 602, and the like.

The transistor 670 includes the backgate 608 over the substrate 601, the oxide semiconductor layer 604 over the insulating layer 651, the insulating layer 603 over the oxide semiconductor layer 604, the gate 602 over the insulating layer 603, an insulating layer 654 over the insulating layer 651 and the oxide semiconductor layer 604, an insulating layer 656 over the insulating layer 654, the pair of electrodes 605a and 605b electrically connected to the oxide semiconductor layer 604 through openings provided in the insulating layers 654 and 656, and the insulating layer 652 over the insulating layer 656 and the pair of electrodes 605a and 605b.

The insulating layer 654 is formed using, for example, an insulating film containing hydrogen. As an example of the insulating film containing hydrogen, a silicon nitride film can be given. Hydrogen contained in the insulating layer 654 is bonded to oxygen vacancies in the oxide semiconductor layer 604 to be carriers in the oxide semiconductor layer 604. Thus, in the structure illustrated in FIG. 16C, regions where the oxide semiconductor layer 604 and the insulating layer 654 are in contact with each other refer to an n-type region 604b and an n-type region 604c. Note that a region between the n-type region 604b and the n-type region 604c serves as a channel region 604a.

By providing the n-type regions 604b and 604c in the oxide semiconductor layer 604, contact resistance with the pair of electrodes 605a and 605b can be reduced. The n-type regions 604b and 604c can be formed in a self-aligned manner using the insulating layer 654 covering the gate 602 at the time of forming the gate 602. The transistor 670 illustrated in FIG. 16C is what is called a top-gate transistor having a self-aligned structure. With a top-gate transistor having a self-aligned structure, an overlap of the gate 602 and the pair of electrodes 605a and 605b serving as a source electrode and a drain electrode is not formed, which enables a reduction in parasitic capacitance between the electrodes.

The insulating layer 656 included in the transistor 670 can be formed using a silicon oxynitride film, for example.

Embodiment 4

In this embodiment, a transistor including an oxide semiconductor in a channel formation region (OS transistor) is described. The OS transistor can be used as a transistor included in the semiconductor device described in the above embodiment.

<Characteristics of OS Transistor>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1 \times 10^{17}/cm^3$, lower than $1 \times 10^{15}/cm^3$, or lower than $1 \times 10^{13}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves an ultra-low off-state current.

For example, the OS transistor with reduced off-state current can exhibit an off-state current per micrometer in channel width of $1 \times 10^{-18}$ A or less, $1 \times 10^{-21}$ A or less, or $1×10^{-24}$ A or less at room temperature (approximately 25° C.), or $1×10^{-15}$ A or less, $1×10^{-18}$ A or less, or $1×10^{-21}$ A or less at 85° C.

<Off-State Current>

Unless otherwise specified, the off-state current in this specification refers to a drain current of a transistor in the off state (also referred to as non-conduction state or cutoff state). Unless otherwise specified, the off state of an n-channel transistor means that a voltage (Vgs) between its gate and source is lower than the threshold voltage (Vth), and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1×10^{-9}$ A at Vgs of 0.5 V, $1×10^{-13}$ A at Vgs of 0.1 V, $1×10^{-9}$ A at Vgs of −0.5 V, and $1×10^{-21}$ A at Vgs of −0.8 V. The drain current of the transistor is $1×10^{-19}$ A or lower at Vgs of −0.5 V or at Vgs in the range of −0.8 V to −0.5 V; therefore, it can be said that the off-state current of the transistor is $1×10^{-19}$ A or lower. Since there is Vgs at which the drain current of the transistor is $1×10^{-22}$ A or lower, it may be said that the off-state current of the transistor is $1×10^{-22}$ A or lower.

In this specification, the off-state current of a transistor with a channel width W is sometimes represented by a current value per the channel width W or by a current value per given channel width (e.g., 1 µm). In the latter case, the off-state current may be expressed in the unit with the dimension of current per length (e.g., A/µm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to 1 at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to 1" may refer to a situation where there is Vgs at which the off-state current of a transistor is lower than or equal to 1 at Vds of 0.1 V, 0.8 V, 1 V, 12 V, 1.8 V, 2.5 V 3 V, 3.3 V, 10 V, 12 V, 16 V, or 20 V, Vds at which the required reliability of a semiconductor device or the like including the transistor is ensured, or Vds at which in the semiconductor device or the like including the transistor is used.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, or 2:1:3 or an oxide with an atomic ratio close to the above atomic ratios. It is particularly preferable to use an In—Ga—Zn-based oxide with an atomic ratio of In:Ga:Zn=4:2:3 or close thereto. An oxide semiconductor film of an In—Ga—Zn-based oxide with an atomic ratio of In:Ga:Zn=4:2:3 or close thereto is formed using a target with an atomic ratio of In:Ga:Zn=4:2:4.1.

<Impurity in Oxide Semiconductor>

If an oxide semiconductor film forming the semiconductor layer contains hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For this reason, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film.

<Structure of Oxide Semiconductor>

Next, a structure of an oxide semiconductor will be described.

Note that in this specification, the term "parallel" indicates that an angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to I am and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal pans in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—C layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to form an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal $InGaZnO_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower then 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve highly favorable off-state current characteristics.

Embodiment 5

Composition of CAC-OS

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and 74 are real numbers greater than 0), or the like, and a mosaic pattern is formed. Then, InO$_{X1}$ and In$_{X2}$Zn$_{Y2}$O$_{Z2}$ forming the mosaic pattern are evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1-x0)}$Ga$_{(1-x0)}$O$_3$(ZnO)$_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in pan thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30% and 100%.

<<Analysis by X-Ray Diffraction>>

In this section, results of X-ray diffraction (XRD) measurement performed on the nine samples are described. As an XRD apparatus, DS ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 22:
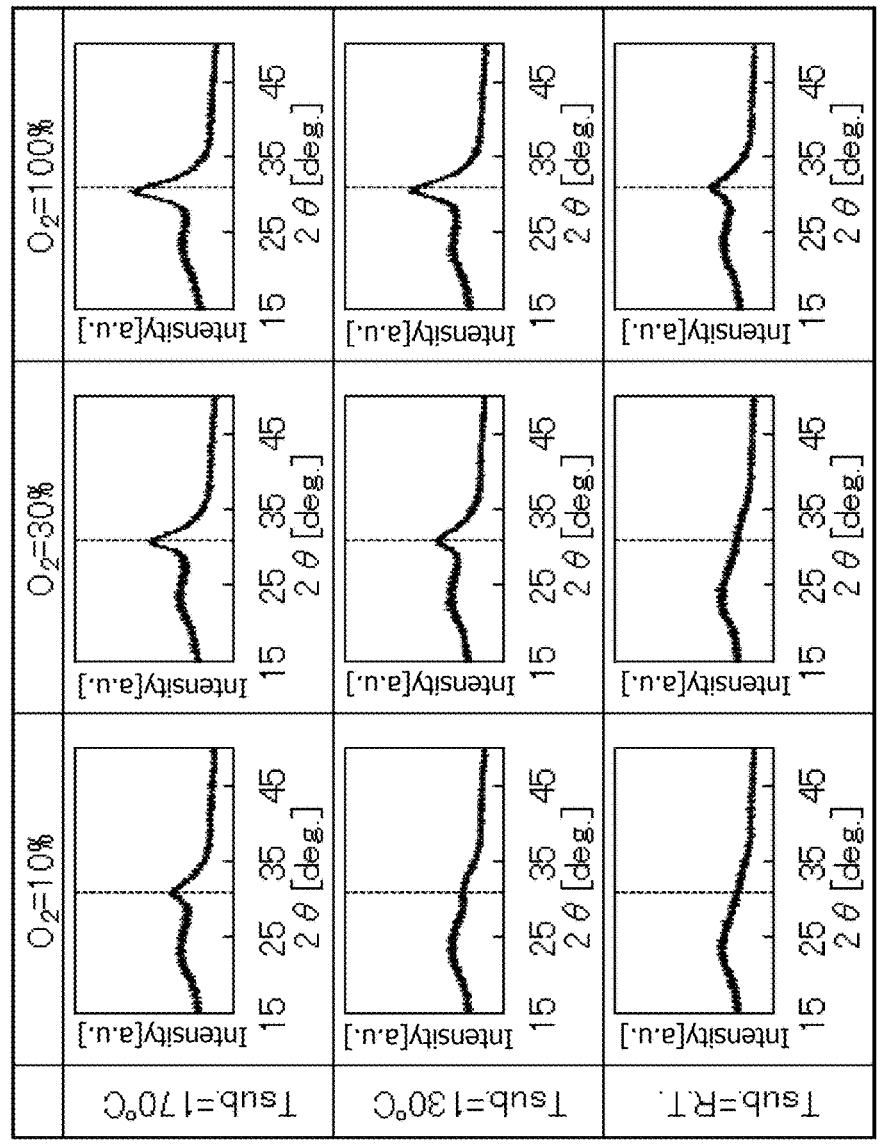
FIG. 22 shows measured XRD spectra of samples.

FIG. 22 shows XRD spectra measured by an out-of-plane method. In FIG. 22, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 22, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 22, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 23A is a plan-view TEM image of the sample formed at a substrate temperature of R.T. and with an oxygen gas flow rate ratio of 10%. FIG. 23B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 23A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 23C, 23D, 23E, 23F, and 23G show the results of the points indicated by the black dots a1, a2, a3, a4, and a5, respectively.

In FIGS. 23C, 23D, 23E, 23F, and 23G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 23B of the sample formed at a substrate temperature of R.T. and an oxygen gas flow rate ratio of 10% are observed. FIGS. 23H, 23I, 23J, 23K, and 23L show the results of the points indicated by the black dots b1, b2, b3, b4, and b5, respectively.

In FIGS. 23H, 23I, 23J, 23K, and 23L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 24A:
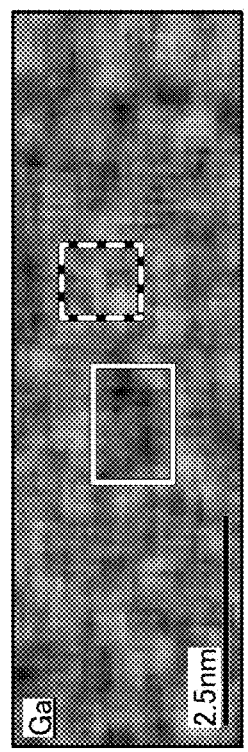
FIGS. 24A to 24C show EDX mapping images of a sample.
Figure 24B:
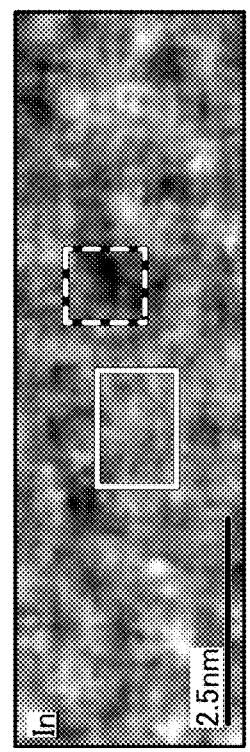
Figure 24C:
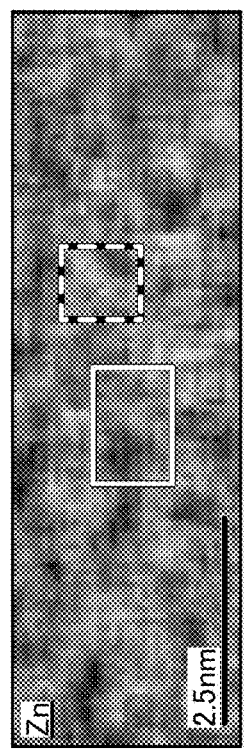

FIGS. 24A to 24C show EDX mapping images in a cross section of the sample formed at a substrate temperature of R.T. and with an oxygen gas flow rate ratio of 10%. FIG. 24A shows an EDX mapping image of Ga atoms. The proportion of the Ga atoms in all the atoms is 1.18 atomic % to 18.64 atomic %. FIG. 24B shows an EDX mapping image of In atoms. The proportion of the In atoms in all the atoms is 9.28 atomic % to 33.74 atomic %. FIG. 24C shows an EDX mapping image of Zn atoms. The proportion of the Zn atoms in all the atoms is 6.69 atomic % to 24.99 atomic %. FIGS. 24A to 24C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 24A to 24C is 7200000 times.

The EDX mapping images in FIGS. 24A to 24C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 24A to 24C are examined.

In FIG. 24A, a relatively dark region occupies a large area in the area surrounded by the solid line, while a relatively bright region occupies a large area in the area surrounded by the dashed line. In FIG. 24B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 24C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 24C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 24A to 24C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 24A to 24C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (I) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments and the other examples described in this specification as appropriate.

Embodiment 6

In this embodiment, a display module including a display device in which the semiconductor devices described in the above embodiment is used is described. For example, the semiconductor device can be used in part of a gate driver circuit portion, a source driver circuit portion, or a pixel portion. An example of the display module is described below with reference to FIG. 17 and FIG. 18.

<Plan View of Display Module>

Figure 17:
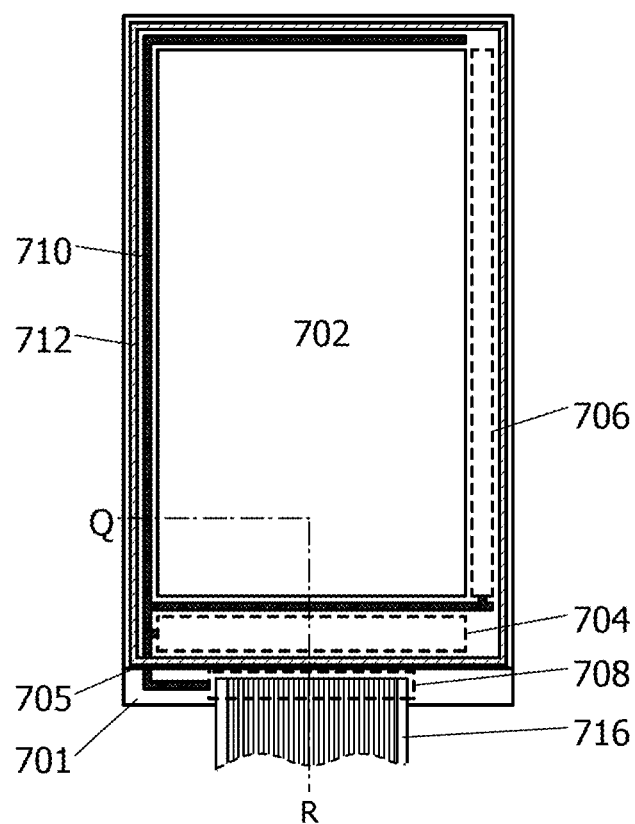
FIG. 17 is a top view illustrating one embodiment of the present invention.

FIG. 17 is a top view of an example of a display module. A display module 700 illustrated in FIG. 17 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 17, a display element is provided between the first substrate 701 and the second substrate 705.

In the display module 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display module 700. An example of the display module 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display module 700 include a plurality of transistors. As the plurality of transistors, any of the transistors that are described in the above embodiments can be used.

The display module 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption. Note that in this embodiment, a structure including a liquid crystal element as a display element is described below.

As a display method in the display module 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases. Note that in this embodiment, a structure in which a backlight and the like are not provided, that is, a so-called reflective liquid crystal display module is described below.

<Cross-Sectional View of Display Module>

Figure 18:
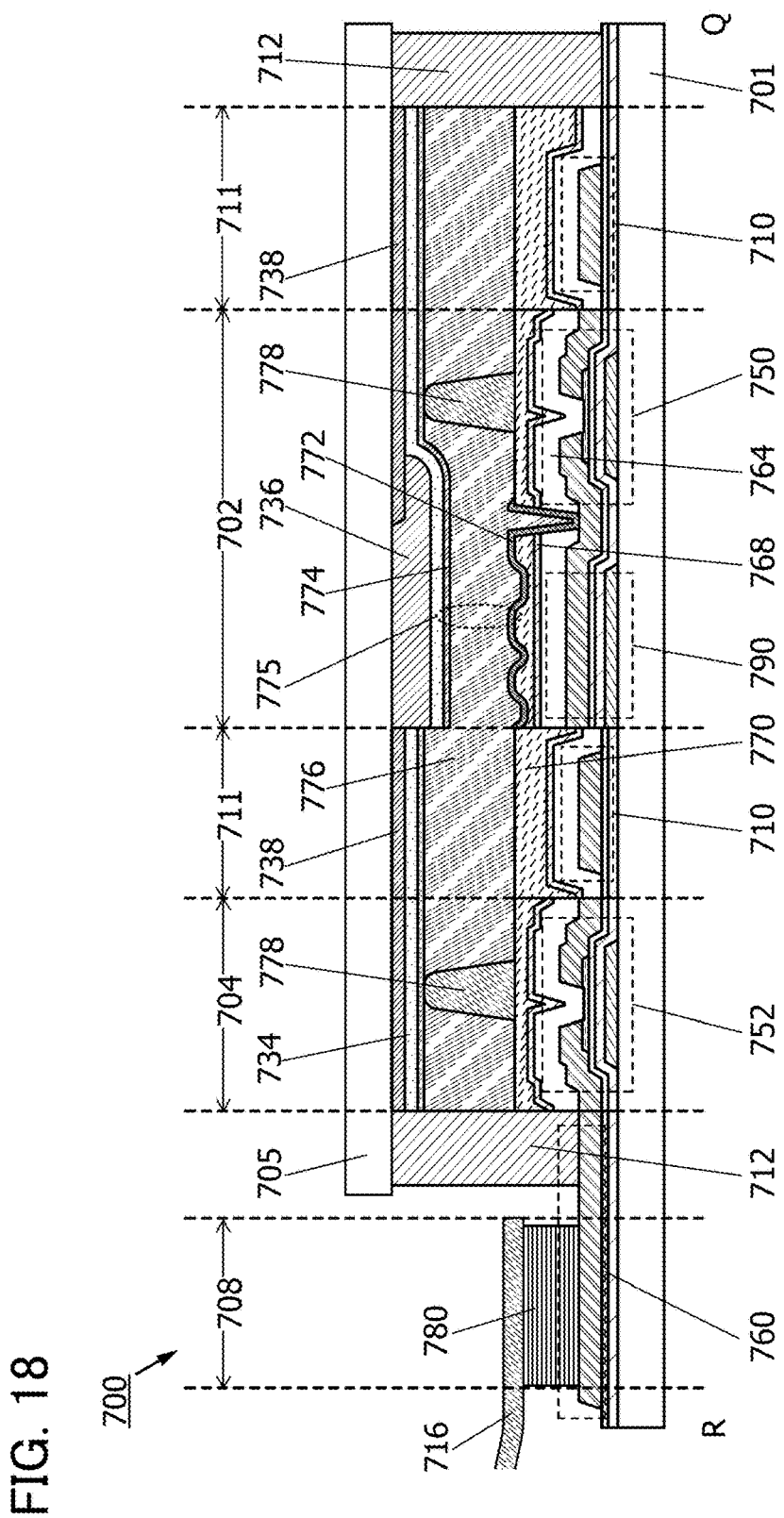
FIG. 18 is a cross-sectional view illustrating one embodiment of the present invention.

FIG. 18 is a cross-sectional view taken along dashed-dotted line Q-R in FIG. 17. The display module illustrated in FIG. 18 is described in detail below.

The display module 700 illustrated in FIG. 18 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 18, insulating films 764 and 768 and a planarization insulating film 770 are formed over the transistor 750, the transistor 752, and the capacitor 790.

As the insulating film 764, a silicon oxide film, a silicon oxynitride film, or the like may be formed by a PECVD apparatus, for example. As the insulating film 768, a silicon nitride film or the like may be formed by a PECVD apparatus, for example. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film formed in the same process as a conductive film functioning as a gate may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

In the cross-sectional view illustrated in FIG. 18 as an example, the display module 700 includes a liquid crystal element 775. The liquid crystal element 775 includes a conductive film 772, a conductive film 774, and a liquid crystal layer 776. The liquid crystal layer 776 is formed using a liquid crystal material having a dielectric constant anisotropy of greater than or equal to 2 and less than or equal to 3.8. The conductive film 774 is provided on the second substrate 705 side and functions as a counter electrode. The display module 700 in FIG. 18 is capable of displaying an image in such a manner that transmission or non-transmission of light is controlled by change in the alignment state of the liquid crystal layer 776 depending on a voltage applied to the conductive film 772 and the conductive film 774.

The conductive film 772 is connected to the conductive film functioning as a source electrode or a drain electrode included in the transistor 750. The conductive film 772 is formed over the planarization insulating film 770 to function as a pixel electrode, i.e., one electrode of the display element. The conductive film 772 has a function of a reflective electrode. The display module 700 in FIG. 18 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal film that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display module 700 in FIG. 18. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved. As illustrated in FIG. 18, a reflective color liquid crystal display device can display an image without a backlight, which enables a reduction in power consumption.

Note that the display module 700 illustrated in FIG. 18 is a reflective color liquid crystal display module given as an example, but a display type is not limited thereto. For example, a transmissive color liquid crystal display module in which the conductive film 772 is a conductive film that transmits visible light may be used. In the case of a transmissive color liquid crystal display module, projections and depressions are not necessarily provided on the planarization insulating film 770.

Although not illustrated in FIG. 18, an alignment film may be provided on a side of the conductive film 772 in contact with the liquid crystal layer 776 and on a side of the conductive film 774 in contact with the liquid crystal layer 776. Although not illustrated in FIG. 18, an optical member (an optical substrate) and the like such as a polarizing member, a retardation member, or an anti-reflection member may be provided as appropriate. For example, circular polarization may be employed by using a polarizing substrate and a retardation substrate. In the case of the transmissive display module or the semi-transmissive display module, a backlight, a sidelight, or the like may be used as a light source.

As the liquid crystal element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

Embodiment 7

In this embodiment, an input/output device (also referred to as a touch panel) obtained by providing a touch sensor (a contact sensor device) for the display module described in the above embodiment is described with reference to FIGS. 19A to 19C and FIG. 20. Hereinafter, the description of the same portions as those in the above embodiments is omitted in some cases.

FIGS. 19A to 19C are projection drawings illustrating a structure of the input/output device.

FIG. 19A is a projection drawing of an input/output device 800, and FIG. 19B is a projection drawing illustrating a structure of a sensor unit 820U included in the input/output device 800.

Figure 20:
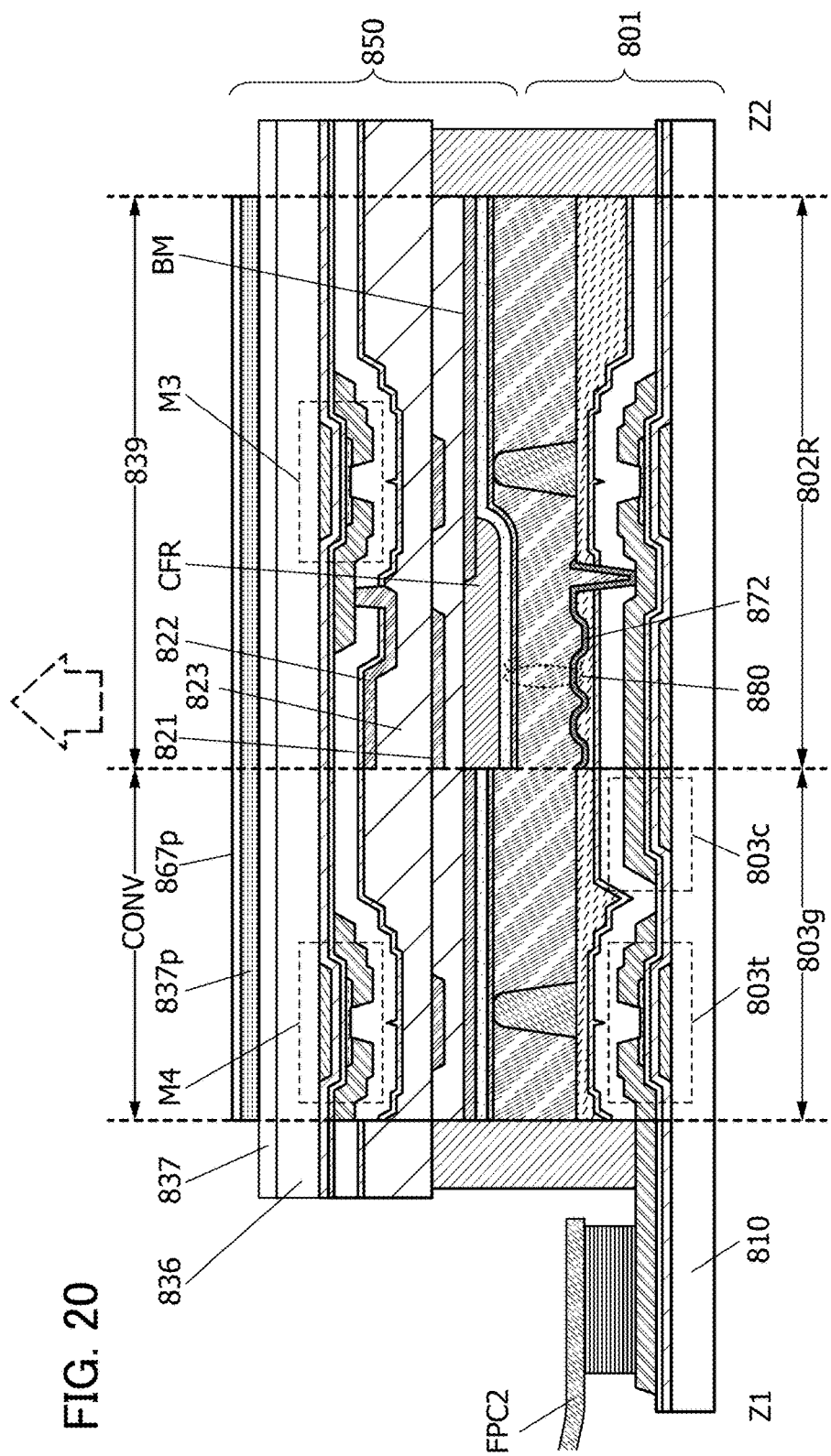
FIG. 20 is a cross-sectional view illustrating one embodiment of the present invention.

FIG. 20 is a cross-sectional view taken along line Z1-Z2 of the input/output device 800 in FIG. 19A.

The input/output device 800 described in this embodiment includes an input device 850 and a display module 801. The input device 850 includes a plurality of sensor units 820U arranged in a matrix and each provided with window portions 834 transmitting visible light, a scan line G1 electrically connected to a plurality of sensor units 820U placed in the row direction (indicated by arrow Rx in the drawing), a signal line DL electrically connected to a plurality of sensor units 820U placed in the column direction (indicated by arrow Ry in the drawing), and a first base material 836 supporting the sensor unit 820U, the scan line G1, and the signal line DL. The display module 801 includes a plurality of pixels 802 overlapping with the window portions 834 and arranged in a matrix and a second base material 810 supporting the pixels 802 (see FIGS. 19A to 19C).

The sensor unit 820U includes a sensor element Ca overlapping with the window portion 834 and a sensor circuit 839 electrically connected to the sensor element Ca (see FIG. 19B).

The sensor element Ca includes an insulating layer 823, and a first electrode 821 and a second electrode 822 between which the insulating layer 823 (not illustrated in FIG. 19B) is sandwiched (see FIG. 19B).

A selection signal is supplied to the sensor circuit 839, and the sensor circuit 839 supplies a sensor signal DATA based on the change in capacitance of the sensor element Ca.

The scan line G1 can supply the selection signal, the signal line DL can supply the sensor signal DATA, and the sensor circuit 839 is placed to overlap with gaps between the plurality of window portions 834.

In addition, the input/output device 800 described in this embodiment includes a coloring layer between the sensor unit 820U and the pixel 802 overlapping with the window portion 834 of the sensor unit 820U.

The input/output device 800 described in this embodiment includes the input device 850 including the plurality of sensor units 820U, each of which is provided with the window portions 834 transmitting visible light, and the display module 801 including the plurality of pixels 802 overlapping with the window portions 834. The coloring layer is included between the window portion 834 and the pixel 802.

With such a structure, the input/output device can supply a sensor signal based on the change in the capacitance and positional information of the sensor unit supplying the sensor signal and can display image data relating to the positional information of the sensor unit. As a result, a novel input/output device with high convenience or high reliability can be provided.

The input/output device 800 may include a flexible substrate FPC1 to which a signal from the input device 850 is supplied and/or a flexible substrate FPC2 supplying a signal including image data to the display module 801.

In addition, a protective base material 837 or a protective layer 837p that protects the input/output device 800 by preventing damage and/or an anti-reflective layer 867p that weakens the intensity of external light reflected by the input/output device 800 may be included.

Moreover, the input/output device 800 includes a scan line driver circuit 803g that supplies the selection signal to a scan line of the display module 801, a wiring 811 supplying a signal, and a terminal 819 electrically connected to the flexible substrate FPC2.

Components of the input/output device 800 are described below. Note that these components cannot be clearly distinguished and one component may also serve as another component or include pan of another component. For example, the input device 850 including the coloring layer overlapping with the plurality of window portions 834 also serves as a color filter.

The input/output device 800 includes the input device 850 and the display module 801 (see FIG. 19A).

The input device 850 includes the plurality of sensor units 8201 and the first, base material 836 supporting the sensor units 820U. For example, the plurality of sensor units 820U are arranged in a matrix with 40 rows and 15 columns on the first base material 836.

The window portion 834 transmits visible light.

A coloring layer transmitting light of a predetermined color is provided to overlap with the window portion 834. For example, a coloring layer CFB transmitting blue light, a coloring layer CFG transmitting green light, and a coloring layer CFR transmitting red light are included (see FIG. 19B).

Note that, in addition to the coloring layers transmitting blue light, green light, and/or red light, coloring layers transmitting light of various colors such as a coloring layer transmitting white light and a coloring layer transmitting yellow light can be included.

For a coloring layer, a metal material, a pigment, dye, or the like can be used.

A light-blocking layer BM is provided to surround the window portions 834. The light-blocking layer BM does not easily transmit light as compared to the window portion 834.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 839 are provided to overlap with the light-blocking layer BM.

Note that a light-transmitting overcoat layer covering the coloring layer and the light-blocking layer BM can be provided.

The sensor element Ca includes the first electrode 821, the second electrode 822, and the insulating layer 823 between the first electrode 821 and the second electrode 822 (see FIG. 20).

The first electrode 821 is formed in, for example, an island shape so as to be apart from other regions. A layer that can be formed in the same process as that of the first electrode 821 is preferably placed close to the first electrode 821 so that the user of the input/output device 800 does not recognize the first electrode 821. Further preferably, the number of the window portions 834 placed in the gap between the first electrode 821 and the layer placed close to the first electrode 821 is reduced as much as possible. In particular, the window portion 834 is preferably not placed in the gap.

When an object whose dielectric constant is different from that of the air gets closer to the first electrode 821 or the second electrode 822 of the sensor element Ca that is put in the air, the capacitance of the sensor element Ca is changed. Specifically, when a finger or the like gets closer to the sensor element Ca, the capacitance of the sensor element Ca is changed. Thus, the sensor element Ca can be used in a proximity sensor.

The first electrode 821 and the second electrode 822 include a conductive material.

For example, an inorganic conductive material, an organic conductive material, a metal material, a conductive ceramic material, or the like can be used for the first electrode 821 and the second electrode 822.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used for the first electrode 821 and the second electrode 822.

Alternatively, a conductive oxide such as indium oxide, indium tin oxide, indium zinc oxide, zinc oxide, or zinc oxide to which gallium is added can be used for the first electrode 821 and the second electrode 822.

Alternatively, graphene or graphite can be used for the first electrode 821 and the second electrode 822. The film including graphene can be formed, for example, by reducing a film containing graphene oxide. As a reducing method, a method with application of heat, a method using a reducing agent, or the like can be employed.

Alternatively, a conductive polymer can be used for the first electrode 821 and the second electrode 822.

The sensor circuit 839 includes transistors M1 to M3, for example. In addition, the sensor circuit 839 includes wirings supplying a power supply potential and a signal. For example, the signal line DL, the wiring VPI, a wiring CS, the scan line G1, the wiring RES, and the wiring VRES are included.

Note that the sensor circuit 839 may be placed not to overlap with the window portion 834.

A conductive material can be used for the wirings (e.g., the signal line DL, the wiring VPI, the wiring CS, the scan line G1, the wiring RES, and the wiring VRES). For example, an inorganic conductive material, an organic conductive material, a metal material, a conductive ceramic material, or the like can be used for the wirings. Alternatively, a material which is the same as those of the first electrode 821 and the second electrode 822 may be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 839 may be formed on the first base material 836. Alternatively, the sensor circuit 839 formed on another base material may be transferred to the first base material 836.

Examples of the materials of the first base material 836 and the second base material 810 are glass substrates or flexible materials (e.g., a resin, a resin film, and a plastic film).

More specifically, non-alkali glass, soda-lime glass, potash glass, crystal glass, or the like can be used for the first base material 836 and the second base material 810. Alternatively, a resin film or resin plate of polyester, polyolefin, polyamide, polyimide, polycarbonate, an acrylic resin, or the like can be used for the first base material 836.

For example, a glass substrate, a resin film or resin plate of polyester, polyolefin, polyamide, polyimide, polycarbonate, an acrylic resin, or the like, a stack thereof, or the like can be used as the protective base material 837 and/or the protective layer 837*p*.

For example, a hard coat layer or a ceramic coat layer can be used as the protective layer 837*p*. Specifically, a layer containing a UV curable resin or aluminum oxide may be formed to overlap with the second electrode 822.

The display module 801 includes the plurality of pixels 802 arranged in a matrix (see FIG. 19C).

For example, the pixel 802 includes a sub-pixel 802B, a sub-pixel 802G, and a sub-pixel 802R, and each sub-pixel includes a display element and a pixel circuit for driving the display element.

In the pixel 802, the sub-pixel 802B is placed to overlap with the coloring layer CFB, the sub-pixel 802G is placed to overlap with the coloring layer CFG, and the sub-pixel 802R is placed to overlap with the coloring layer CFR.

The coloring layer CFR is positioned in a region overlapping with the liquid crystal element 880. Note that the liquid crystal element 880 includes a reflective electrode 872 as one electrode (see FIG. 20). Thus, part of external light reflected by the reflective electrode 872 passes through the coloring layer CFR and is emitted in a direction indicated by an arrow in the drawing. The reflective electrode 872 can have a structure similar to that of the conductive film 772 serving as the reflective electrode in the above embodiment. The liquid crystal element 880 includes a liquid crystal layer having a dielectric constant anisotropy of greater than or equal to 2 and less than or equal to 3.8.

The light-blocking layer BM is provided to surround the coloring layer (e.g., the coloring layer CFR).

The scan line driver circuit 803*g* includes a transistor 803*t* and a capacitor 803*c* (see FIG. 20).

Various circuits that can convert the sensor signal DATA supplied from the sensor unit 820U and supply the converted signal to the flexible substrate FPC1 can be used as a converter CONV (see FIG. 19A and FIG. 20).

For example, a transistor M4 can be used in the converter CONV.

The display module 801 includes the anti-reflective layer 867p positioned in a region overlapping with pixels. As the anti-reflective layer 867p, a circular polarizing plate can be used, for example.

As illustrated in FIG. 19A, the display module 801 includes the wirings 811 through which signals can be supplied. The wirings 811 are provided with the terminal 819. Note that the flexible substrate FPC2 through which a signal such as an image signal or a synchronization signal is supplied is electrically connected to the terminal 819.

Note that a printed wiring board (PWB) may be attached to the flexible substrate FPC2.

The display module 801 includes wirings such as scan lines, signal lines, and power supply lines. Any of various conductive films can be used as the wirings.

For the wirings included in the display module 801, for example, a metal element selected from aluminum, chromium, copper, tantalum, titanium, molybdenum, tungsten, nickel, yttrium, zirconium, silver, and manganese; an alloy including any of the above-described metal elements; or an alloy including any of the above-described metal elements in combination can be used. In particular, one or more elements selected from aluminum, chromium, copper, tantalum, titanium, molybdenum, and tungsten are preferably included, In particular, an alloy of copper and manganese is suitably used in microfabrication with the use of a wet etching method.

As specific structures of the wirings included in the display module 801, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a stacked structure in which an alloy film or a nitride film which contains one or more elements selected from titanium, tantalum, tungsten, molybdenum, chromium, neodymium, and scandium is stacked over an aluminum film can be used. Alternatively, a light-transmitting conductive material including indium oxide, tin oxide, or zinc oxide may be used.

Embodiment 8

In this embodiment, specific examples of electronic devices each of which is manufactured using the liquid crystal display device described in the above embodiment are described with reference to FIGS. 21A to 21C.

Examples of electronic devices to which one embodiment of the present invention can be applied include a television set (also referred to as a television or a television receiver), a monitor of a computer or the like, a camera such as a digital camera or a digital video camera, a digital photo frame, a mobile phone, a portable game machine, a portable information terminal, a music reproducing device, a game machine (e.g., a pachinko machine or a slot machine), and a game console. FIGS. 21A to 21C illustrate specific examples of these electronic devices.

Figure 21A:
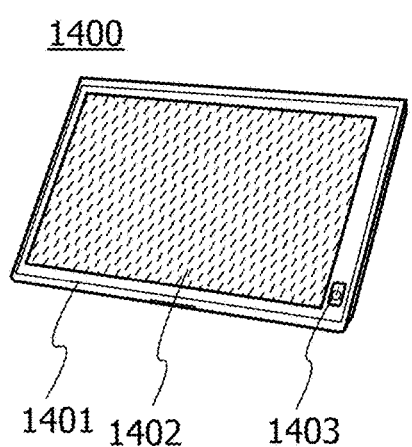
FIGS. 21A to 21C illustrate electronic devices according to one embodiment of the present invention.

FIG. 21A illustrates a portable information terminal 1400 including a display portion. The portable information terminal 1400 includes a display portion 1402 and an operation button 1403 which are incorporated in a housing 1401. The liquid crystal display device of one embodiment of the present invention can be used for the display portion 1402.

Figure 21B:
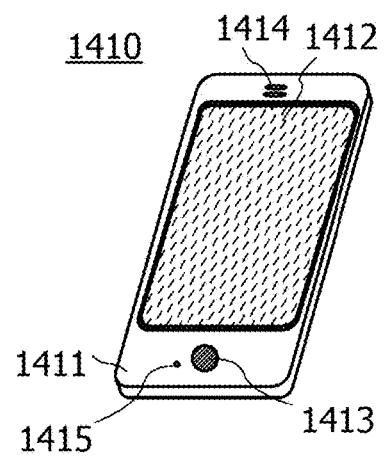

FIG. 21B illustrates a cellular phone 1410. The cellular phone 1410 includes a display portion 1412, an operation button 1413, a speaker 1414, and a microphone 1415 which are incorporated in a housing 1411. The liquid crystal display device of one embodiment of the present invention can be used for the display portion 1412.

Figure 21C:
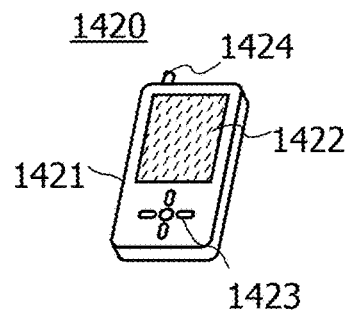

FIG. 21C illustrates a music reproducing device 1420. The music reproducing device 1420 includes a display portion 1422, an operation button 1423, and an antenna 1424 which are incorporated in a housing 1421. In addition, the antenna 1424 transmits and receives data via a wireless signal. The liquid crystal display device of one embodiment of the present invention can be used for the display portion 1422.

The display portions 1402, 1412, and 1422 each have a touch-input function. When a user touches a displayed button (not illustrated) which is displayed on the display portion 1402, 1412, or 1422 with his/her fingers or the like, the user can carry out operation on the screen and input of information.

When the liquid crystal display device described in the above embodiment is used for the display portions 1402, 1412, and 1422, the display quality of the display portions 1402, 1412, and 1422 can be improved.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on the Description for Drawings>

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms that are not mentioned in the above embodiments.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed in a plan view of the transistor.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate overlap with each other is referred to as a surrounded channel width (SCW) in some cases. Further, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Pixel>>

In this specification and the like, one pixel refers to one element whose brightness can be controlled, for example. Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel.

Note that the number of color elements is not limited to three, and more color elements may be used. For example, RGBW (W: white), RGB added with yellow, cyan, or magenta, and the like may be employed.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include. "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

This application is based on Japanese Patent Application serial no. 2015-151416 filed with Japan Patent Office on Jul. 31, 2015, and Japanese Patent Application serial no. 2016-117684 filed with Japan Patent Office on Jun. 14, 2016, the entire contents of which are hereby incorporated by reference.

What is claimed is:

1. A semiconductor device comprising:
a first transistor comprising a gate and a backgate;
a second transistor comprising a gate; and
a circuit comprising a third transistor,
wherein the gate of the first transistor is electrically connected to a first input terminal,
wherein one of a source and a drain of the first transistor is electrically connected to a first wiring,
wherein the gate of the second transistor is electrically connected to a second input terminal,
wherein one of a source and a drain of the second transistor is electrically connected to a second wiring,
wherein the other of the source and the drain of the first transistor and the other of the source and the drain of the second transistor are electrically connected to an output terminal,
wherein one of a source and a drain of the third transistor is electrically connected to the first input terminal,
wherein the other of the source and the drain of the third transistor is electrically connected to the backgate of the first transistor,
wherein the circuit is configured to switch between a first state and a second state in accordance with a control signal,
wherein the first state is a state in which the backgate of the first transistor is electrically connected to the first input terminal, and
wherein the second state is a state in which the backgate of the first transistor is electrically connected to the output terminal.

2. The semiconductor device according to claim 1, further comprising a fifth transistor provided between the gate of the first transistor and the first input terminal.

3. The semiconductor device according to claim 1, further comprising a fifth transistor provided between the gate of the first transistor and the first input terminal,
wherein the fifth transistor comprises a gate and a backgate which are electrically connected to a third wiring.

4. The semiconductor device according to claim 1, wherein the second transistor further comprises a backgate electrically connected to the second input terminal.

5. The semiconductor device according to claim 1, wherein a channel formation region of each of the first transistor and the second transistor comprises an oxide semiconductor.

6. An electronic device comprising the semiconductor device according to claim 1.

7. A semiconductor device comprising:
a first transistor comprising a gate and a backgate;
a second transistor comprising a gate; and
a circuit comprising a third transistor and a fourth transistor,
wherein the gate of the first transistor is electrically connected to a first input terminal,
wherein one of a source and a drain of the first transistor is electrically connected to a first wiring,
wherein the gate of the second transistor is electrically connected to a second input terminal,
wherein one of a source and a drain of the second transistor is electrically connected to a second wiring,
wherein the other of the source and the drain of the first transistor and the other of the source and the drain of the second transistor are electrically connected to an output terminal,
wherein one of a source and a drain of the third transistor is electrically connected to the first input terminal,
wherein the other of the source and the drain of the third transistor and one of a source and a drain of the fourth transistor are electrically connected to the backgate of the first transistor,
wherein the other of the source and the drain of the fourth transistor is electrically connected to the output terminal,
wherein the circuit is configured to switch between a first state and a second state in accordance with a control signal,
wherein the first state is a state in which the backgate of the first transistor is electrically connected to the first input terminal through the third transistor, and
wherein the second state is a state in which the backgate of the first transistor is electrically connected to the output terminal through the fourth transistor.

8. The semiconductor device according to claim 7, further comprising a fifth transistor provided between the gate of the first transistor and the first input terminal.

9. The semiconductor device according to claim 7, further comprising a fifth transistor provided between the gate of the first transistor and the first input terminal,
wherein the fifth transistor comprises a gate and a backgate which are electrically connected to a third wiring.

10. The semiconductor device according to claim 7, wherein the second transistor further comprises a backgate electrically connected to the second input terminal.

11. The semiconductor device according to claim 7, wherein a channel formation region of each of the first transistor and the second transistor comprises an oxide semiconductor.

12. The semiconductor device according to claim 7, wherein the third transistor and the fourth transistor are alternately turned on and off in accordance with the control signal so that the first state and the second state are alternately switched.

13. The semiconductor device according to claim 7,
wherein in the first state, the third transistor is on and the fourth transistor is off in accordance with the control signal, and
wherein in the second state, the third transistor is off and the fourth transistor is on in accordance with the control signal.

14. The semiconductor device according to claim 7,
wherein the third transistor comprises a gate and a backgate which are electrically connected to each other, and
wherein the fourth transistor comprises a gate and a backgate which are electrically connected to each other.

15. An electronic device comprising the semiconductor device according to claim 7.

16. A semiconductor device comprising:
a first transistor comprising a gate and a backgate;
a second transistor comprising a gate; and
a circuit comprising a third transistor and a fourth transistor,
wherein the gate of the first transistor is electrically connected to a first input terminal,
wherein one of a source and a drain of the first transistor is electrically connected to a first wiring,
wherein the gate of the second transistor is electrically connected to a second input terminal, wherein one of a source and a drain of the second transistor is electrically connected to a second wiring, wherein the other of the source and the drain of the first transistor and the other of the source and the drain of the second transistor are electrically connected to an output terminal, wherein one of a source and a drain of the third transistor is electrically connected to the first input terminal, wherein the other of the source and the drain of the third transistor and one of a source and a drain of the fourth transistor are electrically connected to the backgate of the first transistor, and wherein the other of the source and the drain of the fourth transistor is electrically connected to the output terminal.

17. The semiconductor device according to claim 16, wherein the second transistor further comprises a backgate electrically connected to the second input terminal.

18. The semiconductor device according to claim 16, wherein a channel formation region of each of the first transistor and the second transistor comprises an oxide semiconductor.

19. An electronic device comprising the semiconductor device according to claim 16.

\* \* \* \* \*